(12) United States Patent
Sugahara

(10) Patent No.: US 7,682,000 B2
(45) Date of Patent: Mar. 23, 2010

(54) PIEZOELECTRIC ACTUATOR, LIQUID TRANSPORTING APPARATUS AND METHOD OF PRODUCING PIEZOELECTRIC ACTUATOR

(75) Inventor: Hiroto Sugahara, Aichi-ken (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 907 days.

(21) Appl. No.: 11/387,883

(22) Filed: Mar. 24, 2006

(65) Prior Publication Data

US 2006/0214998 A1 Sep. 28, 2006

(30) Foreign Application Priority Data

Mar. 24, 2005 (JP) .............................. 2005-085652

(51) Int. Cl.
*B41J 2/045* (2006.01)
*H01L 41/22* (2006.01)
*H04R 17/00* (2006.01)

(52) U.S. Cl. ......................................... 347/72; 29/25.35
(58) Field of Classification Search .............. 347/71–72
See application file for complete search history.

(56) References Cited

U.S. PATENT DOCUMENTS 4,766,671 A 8/1988 Utsumi et al.
6,604,817 B2 8/2003 Isono et al.
6,631,981 B2 10/2003 Isono et al.
2003/0222240 A1* 12/2003 Sasaki et al. .................. 252/62

FOREIGN PATENT DOCUMENTS

| JP | 3274157 | 12/1991 |
|---|---|---|
| JP | 796301 | 10/1995 |
| JP | 2001260349 | 9/2001 |
| JP | 200219102 | 1/2002 |
| JP | 2004358716 | 12/2004 |

* cited by examiner

*Primary Examiner*—Matthew Luu
*Assistant Examiner*—Lisa M Solomon
(74) *Attorney, Agent, or Firm*—Baker Botts L.L.P.

(57) ABSTRACT

A piezoelectric actuator of an ink-jet head includes a vibration plate covering pressure chambers, and piezoelectric elements formed on a surface of the vibration plate. Each of the piezoelectric elements has stacked piezoelectric layers; individual electrodes and common electrodes arranged alternately between the stacked piezoelectric layers; and base portions of a supporting member formed on a surface of the uppermost piezoelectric layer of the piezoelectric layers. In each of the piezoelectric elements, through holes are formed to extend from a surface of one of the base portions, across the stacked piezoelectric layers, and the individual electrodes are exposed in the surface forming the through hole and the common electrodes are exposed in the surface forming the through hole. Conductive materials are filled in the through holes, respectively. Accordingly, a liquid transporting apparatus in which the structure for electrical connection is simple and easily made is provided.

3 Claims, 18 Drawing Sheets

→ SCANNING DIRECTION
↙ PAPER FEEDING DIRECTION

US 7,682,000 B2

PIEZOELECTRIC ACTUATOR, LIQUID TRANSPORTING APPARATUS AND METHOD OF PRODUCING PIEZOELECTRIC ACTUATOR

BACKGROUND OF THE INVENTION

1. Field of the Invention

The present invention relates to a piezoelectric actuator, a liquid transporting apparatus, and a method for producing a piezoelectric actuator.

2. Description of the Related Art

An example of a liquid-transporting apparatus which transport a liquid is an ink-jet head which discharges ink from its nozzles to perform printing. Such an ink-jet head includes a piezoelectric actuator which applies pressure to ink. This piezoelectric actuator can be exemplified by a piezoelectric actuator which has a plurality of stacked piezoelectric layers and two kinds of plurality of inner electrodes arranged alternately between the piezoelectric layers. Such a piezoelectric actuator is constructed, for example, such that the inner electrodes of one kind are conducted with each other, and the inner electrodes of the other kind are conducted with each other; both kinds of inner electrodes are connected to a drive circuit which applies a drive voltage; and that difference in the electric potential between the two kinds of inner electrodes are generated to deform the piezoelectric layers at portions each of which is sandwiched between an inner electrode of one kind and an inner electrode of the other kind, thereby applying pressure to the ink.

For example, a piezoelectric actuator for an ink-jet head, shown in FIG. 1 of Japanese Patent Application Laid-open No. 2004-358716, has a plurality of piezoelectric elements corresponding to a plurality of nozzles respectively, and each of the piezoelectric elements has a plurality of stacked piezoelectric layers and two kinds of plurality of inner electrodes, in which inner electrodes of one kind and inner electrodes of the other kind are arranged alternately between the stacked piezoelectric layers. In this piezoelectric actuator, the inner electrodes of one kind, which are arranged alternately with the inner electrodes of the other kind intervening therebetween, are conducted with each other via an external electrode formed in one side surface of each of the piezoelectric elements, and the inner electrodes of the other kind, which are arranged alternately with the inner electrodes of one kind intervening therebetween, are conducted with each other via an external electrode formed in the other side surface of each of the piezoelectric elements. Further, the external electrodes on both side surfaces respectively are connected to a drive circuit by a flexible flat cable (FFC). Namely, the piezoelectric actuator is constructed such that a predetermined voltage is applied via the FFC to the inner electrodes of a same kind, which are arranged alternately.

On the other hand, ink-jet heads described in U.S. Pat. No. 6,604,817 (corresponding to Japanese Patent Application Laid-open No. 2001-260349), U.S. Pat. No. 6,631,981 (corresponding to Japanese Patent Application Laid-open No. 2002-19102), and U.S. Pat. No. 4,766,671 (corresponding to Japanese Publication after Examination No. 7-96301) each include piezoelectric elements covering a plurality of pressure chambers respectively. Each of the piezoelectric elements has stacked piezoelectric layers and two kinds of electrodes arranged alternately between the piezoelectric layers, in which electrodes of a same kind are conducted with each other via a conductive material filled in a through hole or groove formed in the piezoelectric layers. In each case, a plurality of terminals (electrodes) connected to the conductive material is formed on a surface of the piezoelectric layer on the side opposite to the pressure chambers, and the electrodes are connected to a drive circuit via these terminals respectively.

However, for connecting a terminal of FFC to each of the outer terminals formed on the side surfaces of each of the piezoelectric elements, a complex structure for electric connection is required. In particular, when the piezoelectric elements are arranged highly densely to perform a high-quality printing, the connection becomes more difficult, which lowers the reliability of electric connection, or increases the cost of production. There is also a fear that the connection between the FFC and the outer electrodes arranged in the side surfaces of piezoelectric element is broken or disconnected when the piezoelectric element is deformed, consequently lowering the reliability of ink-jet head.

Further, in the ink-jet heads, described U.S. Pat. Nos. 6,604,817, 6,631,981, and 4,766,671 respectively, a surface of the piezoelectric layer on the side of pressure chambers is exposed to the pressure chambers. Accordingly, upon forming through holes connecting the electrodes, the location and/or depth of through holes must be carefully determined to prevent the through holes from communicating with the pressure chambers. Further, in the ink-jet head described in each of these U.S. patents, the piezoelectric layer is formed continuously across a plurality of pressure chambers. Therefore, when a certain portion of the piezoelectric layer facing a certain pressure chamber is deformed to apply pressure to the certain pressure chamber, there arises a problem of so-called cross talk in which the deformation of the certain portion of the piezoelectric layer is propagated to another portion of the piezoelectric layer corresponding to a pressure chamber adjacent to the certain pressure chamber. In addition, terminals (electrodes) each connected to a conductive material are formed on a surface of the piezoelectric layer on a side opposite to the pressure chambers to connect these terminals to an external wiring member such as FFC. Since the connection with the external wiring member such as FFC is very weak against external force, the reliability of connection of these terminals to the FFC also becomes a problem in some cases.

SUMMARY OF THE INVENTION

An object of the present invention is to provide a piezoelectric actuator and a liquid transporting apparatus using the piezoelectric actuator in which the structure of electric connection for supplying drive voltage to the inner electrodes of piezoelectric element(s) is simple, easy and reliable, and to provide a method of producing such a piezoelectric actuator.

According to a first aspect of the present invention, there is provided a piezoelectric actuator for a liquid transporting apparatus, which is arranged on one surface of a channel unit in which a liquid channel including a plurality of pressure chambers arranged along a plane is formed, the piezoelectric actuator including: a vibration plate which covers the pressure chambers; and piezoelectric elements which are arranged, on a surface of the vibration plate on a side opposite to the pressure chambers, at positions each of which faces one of the pressure chambers, wherein:

each of the piezoelectric elements has a plurality of stacked piezoelectric layers, a plurality of first electrodes to which predetermined drive voltage is applied, and a plurality of second electrodes which are kept at common reference potential;

the first electrodes and the second electrodes are arranged alternately between the stacked piezoelectric layers;

each of the piezoelectric elements has non-overlapping areas in each of which the first electrodes and the second electrodes are not overlapped with each other as viewed in a direction orthogonal to the plane;

a first hole or groove is formed in one of the non-overlapping areas of each of the piezoelectric elements, the first hole or groove extending in a thickness direction which is a stacking direction of the piezoelectric layers, and being formed by a first electrode-exposure portion in which only the first electrodes are exposed; and a second hole or groove is formed in another of the non-overlapping areas, the second hole or groove extending in the thickness direction up to the vibration plate, and being formed by a second electrode-exposure portion in which only the second electrodes are exposed;

a first conductive material, which electrically conducts the first electrodes with each other, is filled in the first hole or groove formed by the first electrode-exposure portion; and a second conductive material, which electrically conducts the second electrodes with each other and which makes contact with the vibration plate, is filled in the second hole or groove formed by the second electrode-exposure portion; and the first electrodes of each of the piezoelectric elements are connected, on a side of each of the piezoelectric elements, to a first wiring via the first conductive material, the side being opposite to the vibration plate.

According to the first aspect of the present invention, the plurality of first electrodes arranged between the plurality of piezoelectric layers are conducted with each other via the first conductive material filled inside the first hole or groove formed or defined by the first electrode-exposure portion. Further, an electric connecting portion of the first electrodes for connecting the first electrodes to the first wiring is arranged on the side of each of the piezoelectric elements, the side being opposite to the vibration plate. In other words, the first electrodes are connected to the first wiring in each of the piezoelectric elements on its side opposite to the vibration plate. Accordingly, the structure for electric connection for supplying drive voltage to the first electrodes is simplified. In addition, the connection can be made easily on the side of piezoelectric element opposite to the vibration plate, and the reliability of connection can also be improved.

In the piezoelectric actuator of the present invention, the vibration plate may be formed of a conductive material. The second hole or groove, constructed by the second electrode-exposure portion of each of the piezoelectric elements, extends up to the vibration plate formed of conductive material such as metal, and the second conductive material filled in the second hole or groove makes contact with the vibration plate. Accordingly, the second electrodes and vibration plate, which are connected via the second conductive material, can be maintained at same electric potential. In particular, when the second holes or grooves formed by the second electrode-exposure portions in all of the piezoelectric elements are extended up to the vibration plate, the second electrodes of all piezoelectric elements are conducted with one another via the vibration plate. Namely, when the second conductive material of any one of the piezoelectric elements is connected to a drive unit or the like which is maintained at reference potential, the second electrodes of all of the piezoelectric elements and the vibration plate can be maintained at the reference potential. In this case, since there is no need to use a wiring member such as FPC (flexible printed cable) to connect the second electrodes, of each of the piezoelectric elements, with each other, the reliability of connection is improved. It should be noted that the present invention is not limited to an aspect according to which the first and second conductive materials are mutually different, but may include also an aspect according to which these conductive materials are same.

In the piezoelectric actuator of the present invention, the first wiring may be formed on surfaces of each of the piezoelectric elements, the surfaces being on the side opposite to the vibration plate. With this construction, it is possible to easily form the first wiring to be connected to the first conductive material on the surface of each of the piezoelectric elements.

In the piezoelectric actuator of the present invention, the second electrodes of each of the piezoelectric elements may be connected, on the side of each of the piezoelectric elements opposite to the vibration plate, to a second wiring via the second conductive material. According to this construction, the second electrodes are also conducted to each other via the second conductive material filled in the second hole or groove formed by the second electrode-exposure portion, and an electric connection portion of the second electrodes is on the side of each of the piezoelectric elements, the side being opposite to the vibration plate. In other words, the second electrodes are connected to the second wiring on the side of each of the piezoelectric elements opposite to the vibration plate. Accordingly, the structure of electric connection for maintaining the second electrodes at common reference potential is simplified. In addition, the connection can be performed easily on the side of each of the piezoelectric elements opposite to the vibration plate, thereby improving the connection reliability.

In the piezoelectric actuator of the present invention, the second wiring may be formed on surfaces of the piezoelectric elements, the surfaces being on the side opposite to the vibration plate. Accordingly, the second wiring to be connected to the second electrodes can be easily formed on the surfaces of the piezoelectric elements.

In the piezoelectric actuator of the present invention, the first hole formed by the first electrode-exposure portion and the second hole formed by the second electrode-exposure portion may extend linearly across the piezoelectric layers, from the surface of each of the piezoelectric elements on the side opposite to the vibration plate. Accordingly, after stacking the piezoelectric layers, the holes (through holes) each of which extends linearly so as to penetrate through the piezoelectric layers can be formed at a time, thereby simplifying the formation of through holes. In addition, when the first conductive material and the second conductive material are filled into the through holes, from the surface of each of the piezoelectric elements on the side opposite to the vibration plate, for example, by a method of pouring a conductive paste or the like into the through holes, there is no need to perform processing from the side surfaces of each of the piezoelectric elements. Accordingly, it is possible easily to conduct the first electrodes with each other and to conduct the second electrodes with each other.

In the piezoelectric actuator of the present invention, the first electrodes and the second electrodes may not be exposed on a side surface or side surfaces of each of the piezoelectric elements. This makes it possible to prevent the short circuit between the electrodes on the side surfaces of the piezoelectric element.

In the piezoelectric actuator of the present invention, the first groove formed by the first electrode-exposure portion and the second groove formed by the second electrode-exposure portion of each of the piezoelectric elements may extend linearly in the thickness direction, across the piezoelectric layers, the first and second grooves extending on both side surfaces respectively of each of the piezoelectric elements. Accordingly, after stacking a plurality of pieces of piezoelectric layers, the first and second grooves extending linearly across the piezoelectric layers can be formed easily and at a time on both side surfaces respectively of each of the piezoelectric actuators.

In the piezoelectric actuator of the present invention, at least a portion of the vibration plate may be formed of an insulative material; and the first electrode-exposure portion of each of the piezoelectric elements may extend, from the surface of each of the piezoelectric elements on the side opposite to the vibration plate, up to the portion of the vibration plate, the portion being formed of the insulative material. Accordingly, upon forming the first electrode-exposure portion, there is no need to perform highly precise processing for forming the through hole or groove such that the tip portion of through hole or groove is located at a predetermined position inside each of the piezoelectric elements. Therefore, the first electrode-exposure portion can be formed easily. In addition, even when the first conductive material filled in the first electrode-exposure portion makes contact with the vibration plate, the first conductive material and the vibration plate are not conducted with each other. Thus, the reliability of the piezoelectric actuator is not compromised.

In the piezoelectric actuator of the present invention, the vibration plate may formed of a conductive material; and the first electrode-exposure portion may not be extended up to the vibration plate. This can prevent the first conductive material from making contact with the vibration plate, and consequently can prevent the conduction between the first conductive material and the vibration plate.

In the piezoelectric actuator of the present invention, the piezoelectric elements may be connected to each other by a connecting member; and surfaces of the piezoelectric elements on the side opposite to the vibration plate and a surface of the connecting member on a side opposite to the vibration plate may form a substantially flush surface. Further, the first wiring may be formed on the substantially flush surface.

When the piezoelectric elements are connected to each other by the connecting member, and when the surfaces of the piezoelectric elements on the side opposite to the vibration plate and the surface of the connecting member on the side opposite to the vibration plate form a substantially flush surface, a wiring such as the first wiring can be formed easily on the substantially flush surface. In addition, when the connecting member connects the uppermost layers of the piezoelectric elements with each other, for example, it is possible to suppress the crosstalk between the piezoelectric elements as small as possible. This is because, even when the connecting member connects the piezoelectric elements with each other, the deformation of one piezoelectric element is hardly propagated to another piezoelectric element via the connection member.

According to a second aspect of the present invention, there is provided a liquid transporting apparatus including a channel unit in which a plurality of pressure chambers arranged along a plane are formed; and a piezoelectric actuator arranged on one surface of the channel unit, wherein:

the piezoelectric actuator including a vibration plate which covers the pressure chambers, and piezoelectric elements arranged, on a surface of the vibration plate on a side opposite to the pressure chambers, at locations each of which faces one of the pressure chambers;

each of the piezoelectric elements includes a plurality of stacked piezoelectric layers, a plurality of first electrodes to which predetermined drive voltage is applied, and a plurality of second electrodes which are maintained at common reference potential;

the first electrodes and the second electrodes are arranged alternately between the stacked piezoelectric layers;

each of the piezoelectric elements has non-overlapping areas in each of which the first electrodes and the second electrodes are not overlapped with each other as viewed in a direction orthogonal to the plane;

a first hole or groove is formed in one of the non-overlapping areas of each of the piezoelectric elements, the first hole or groove extending in a thickness direction which is a stacking direction of the piezoelectric layers, and being formed by a first electrode-exposure portion in which only the first electrodes are exposed; and a second hole or groove is formed in another of the non-overlapping areas, the second hole or groove extending in the thickness direction up to the vibration plate, and being formed by a second electrode-exposure portion in which only the second electrodes are exposed;

a first conductive material, which electrically conducts the first electrodes with each other, is filled in the first hole or groove formed by the first electrode-exposure portion; and a second conductive material, which electrically conducts the second electrodes with each other and which makes contact with the vibration plate, is filled in the second hole or groove formed by the second electrode-exposure portion; and the first electrodes of each of the piezoelectric elements are connected, on a side of each of the piezoelectric elements, to a first wiring via the first conductive material, the side being opposite to the vibration plate.

According to the second aspect of the present invention, in the liquid transporting apparatus of the present invention, the plurality of first electrodes arranged between the plurality of piezoelectric layers are conducted with each other via the first conductive material filled in the inside of the first hole or groove formed or defined by the first electrode-exposure portion. Further, an electric connecting portion of the first electrodes for connecting the first electrodes to the first wiring is arranged on the side of each of the piezoelectric elements, the side being opposite to the vibration plate. In other words, the first electrodes are connected to the first wiring in each of the piezoelectric elements on its side opposite to the vibration plate. Accordingly, the structure for electric connection for supplying drive voltage to the first electrodes is simplified. In addition, the connection can be made easily on the side of piezoelectric element opposite to the vibration plate, and the reliability of connection can also be improved, thereby consequently improving the reliability of the liquid transporting apparatus as well. In addition, the second electrode-exposure portion of each of the piezoelectric elements extends up to the vibration plate, and the second conductive material filled in the second electrode-exposure portion makes contact with the vibration plate. Accordingly, for example, when the vibration plate is made of a conductive material and when the second electrode-exposure portions in all of the piezoelectric elements are extended up to the vibration plate, there is no need to connect the second electrodes, of each of the piezoelectric elements, with each other on the side of the piezoelectric element opposite to the vibration plate. When the second electrodes of any one of the piezoelectric elements is connected to a wiring connected to ground, the second electrodes of all of the piezoelectric elements and the vibration plate are consequently connected to the second wiring.

According to a third aspect of the present invention, there is provided a method of producing a piezoelectric actuator for a liquid transporting apparatus, the piezoelectric actuator being arranged on one surface of a channel unit in which a plurality of pressure chambers arranged along a plane are formed, the method including:

a stacking step of stacking a plurality of piezoelectric layers to form a stacked body such that: the stacked body has non-overlapping areas at each of which a plurality of first electrodes to which predetermined drive electrode is applied and a plurality of second electrodes which are maintained at common reference potential are not overlapped with each other as viewed in a direction orthogonal to the plane; and that the first electrodes and the second electrodes are arranged alternately between the piezoelectric layers;

a dividing step of dividing the stacked body to form a plurality of piezoelectric elements corresponding to the pressure chambers respectively;

an exposure portion forming step of forming a first hole or groove at one of the non-overlapping areas in each of the piezoelectric elements, the first hole or groove extending linearly from one surface of each of the piezoelectric elements in a thickness direction which is a stacking direction of the piezoelectric layers, and being formed by a first electrode-exposure portion in which only the first electrodes are exposed; and of forming a second hole or groove at another of the non-overlapping areas in each of the piezoelectric elements, the second hole or groove extending linearly from the one surface of each of the piezoelectric elements in the thickness direction, and being formed by a second electrode-exposure portion in which only the second electrodes are exposed;

a filling step of filling a first conductive material, which electrically conducts the first electrodes with each other, in the first hole or groove formed by the first electrode-exposure portion; and of filling a second conductive material, which electrically conducts the second electrodes with each other, in the second hole or groove formed by the second electrode-exposure portion; and a wiring forming step of forming a first wiring to be connected to the first conductive material which is filled in the first hole or groove formed by the first electrode-exposure portion of each of the piezoelectric elements, the first wiring being formed on the one surface of each of the piezoelectric elements.

According to the third aspect of the present invention, after stacking the piezoelectric layers, the first electrodes and the second electrodes, the first and second holes or grooves extending linearly across the piezoelectric layers, the first electrodes and the second electrodes, respectively, can be formed at a time, and these first and second electrode-exposure portions can be formed easily.

According to a fourth aspect of the present invention, there is provided a method of producing a piezoelectric actuator for a liquid transporting apparatus, the piezoelectric actuator being arranged on one surface of a channel unit in which a plurality of pressure chambers arranged along a plane are formed, the method comprising:

a stacking step of stacking a plurality of piezoelectric layers to form a stacked body such that: the stacked body has non-overlapping areas at each of which a plurality of first electrodes to which predetermined drive electrode is applied and a plurality of second electrodes which are maintained at common reference potential are not overlapped with each other as viewed in a direction orthogonal to the plane; and that the first electrodes and the second electrodes are arranged alternately between the piezoelectric layers;

a dividing step of dividing the stacked body to form a plurality of piezoelectric elements corresponding to the pressure chambers respectively; and concurrently forming a first electrode-exposure groove extending linearly in one side surface of each of the piezoelectric elements in a thickness direction which is a stacking direction of the piezoelectric layers, and in which only the first electrodes are exposed, and forming a second electrode-exposure groove extending linearly in the other side surface of each of the piezoelectric elements in the thickness direction, and in which only the second electrodes are exposed;

a filling step of filling, in the first electrode-exposure groove, a first conductive material which electrically conducts the first electrodes exposed in the first exposure groove with each other; and of filling, in the second electrode-exposure groove, a second conductive material which electrically conducts the second electrodes exposed in the second exposure groove with each other; and a wiring forming step of forming a first wiring to be connected to the first conductive material which is filled in the first electrode-exposure groove of each of the piezoelectric elements, the first wiring being formed on one surface of each of the piezoelectric elements.

According to the fourth aspect of the present invention, when the stacked body is divided to form the piezoelectric elements, the first and second electrode-exposure grooves can be formed simultaneously with the forming of piezoelectric elements, thereby simplifying the formation of first and second grooves.

DESCRIPTION OF THE PREFERRED EMBODIMENTS

A preferred embodiment of the present invention will be explained below with reference to the drawings. This embodiment is an example in which the present invention is applied to an ink-jet head which discharges ink onto a recording objective such as paper from its nozzles.

Figure 1:
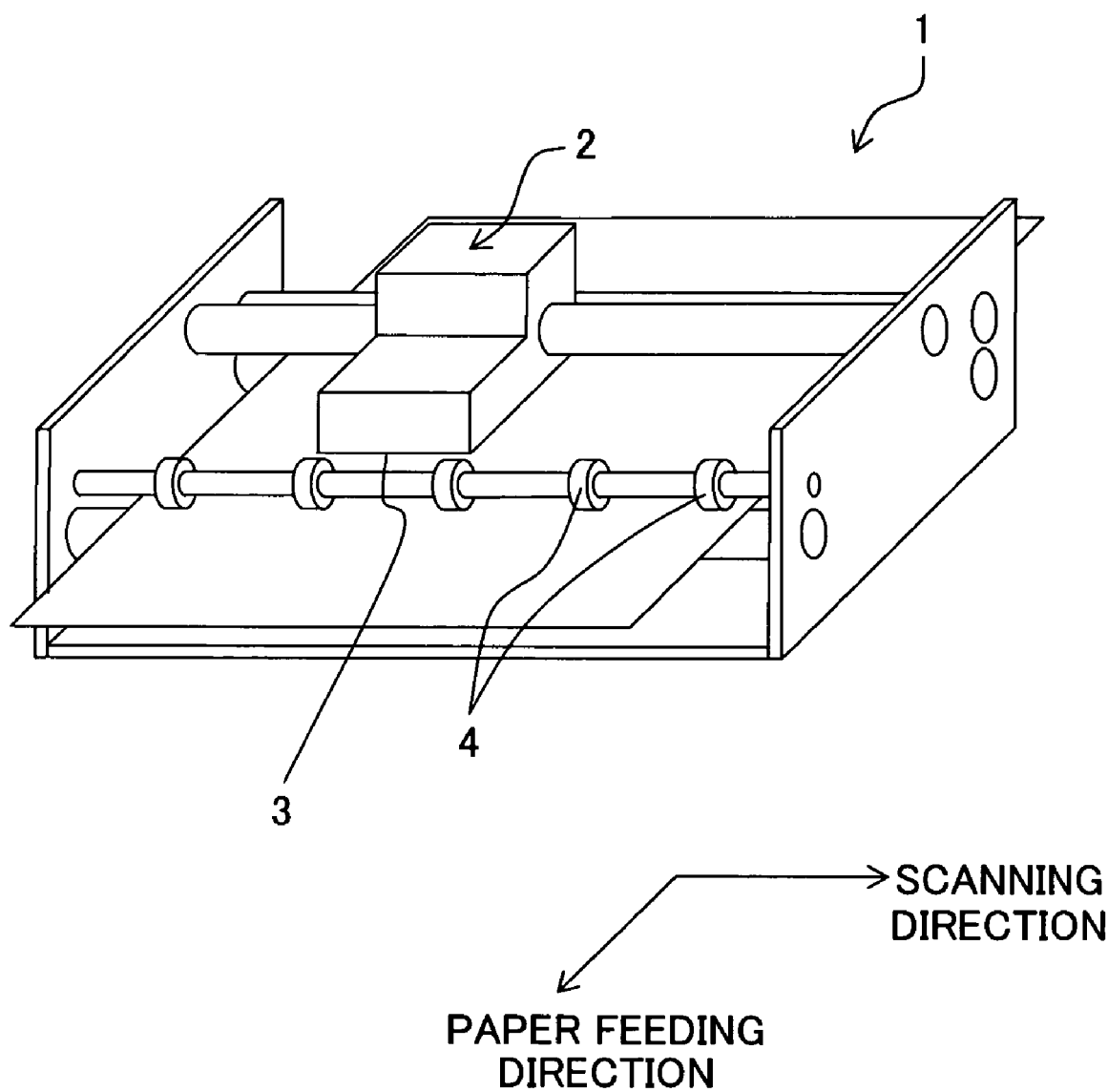
FIG. 1 is a schematic perspective view of an ink-jet printer according to the present invention.

Firstly, the construction of an ink-jet printer 1 which includes an ink-jet head 3 according to the present invention will be explained briefly with reference to FIG. 1. FIG. 1 is a schematic perspective view of the ink-jet head 1 according to the present invention. As shown in FIG. 1, the ink-jet printer 1 includes a carriage 2 which is movable in a left and right direction (scanning direction) in FIG. 1, the ink-jet head 3 (liquid transporting apparatus) of serial type which is provided in the carriage 2 and which discharges ink onto a recording paper P, and transporting rollers 4 which feed the recording paper P in a forward direction (paper feeding direction) in FIG. 1, and the like. The ink-jet head 3 moves integrally with the carriage 2 in the scanning direction and jets ink onto the recording paper P from nozzles 15 (see FIG. 2). Subsequently, the recording paper P, with an image and/or letter or the like recorded thereon by the ink-jet head 3, is discharged in the paper feeding direction by the transporting rollers 4.

Figure 2:
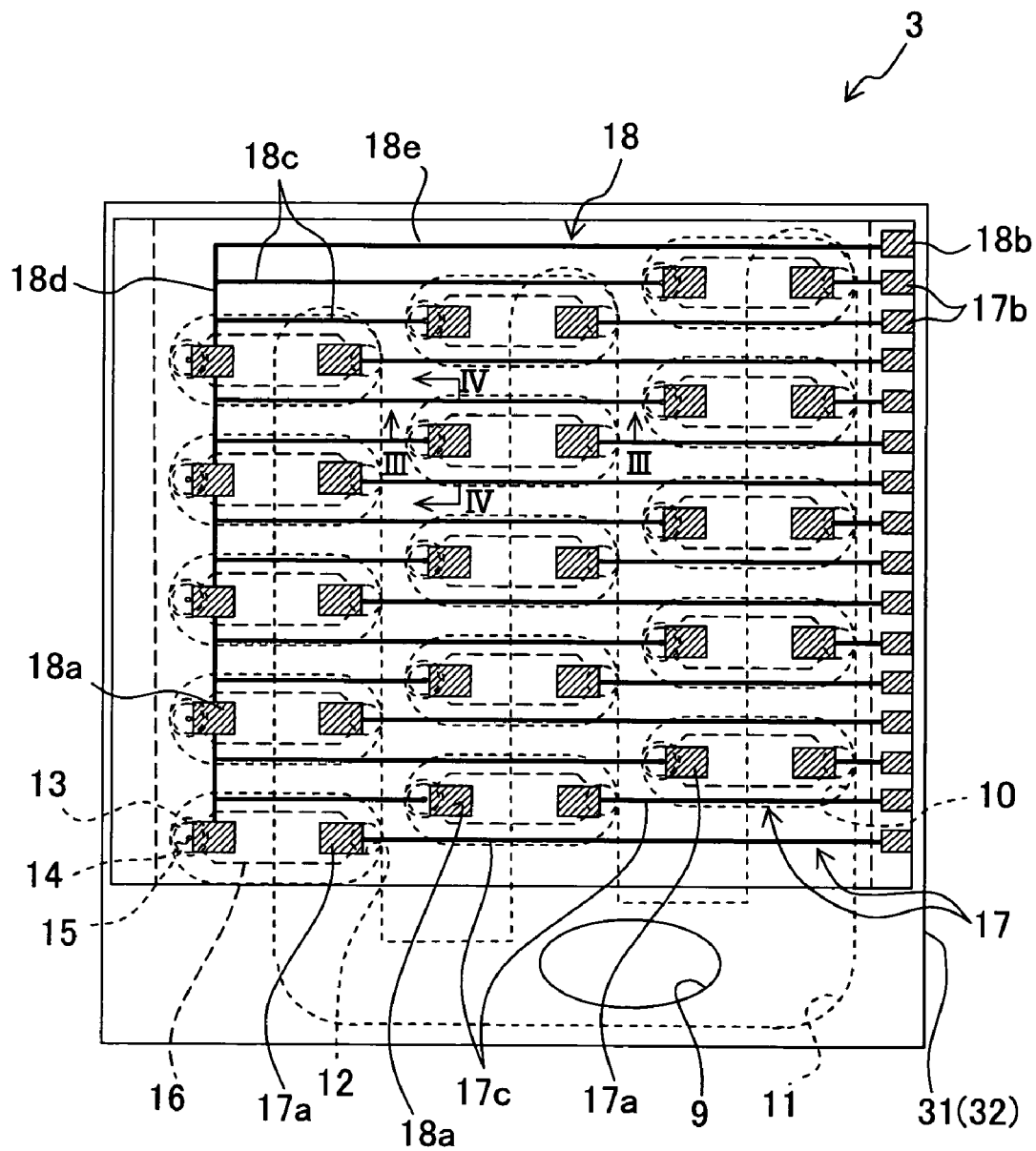
FIG. 2 is a plan view of the ink-jet head shown in FIG. 1.
Figure 3:
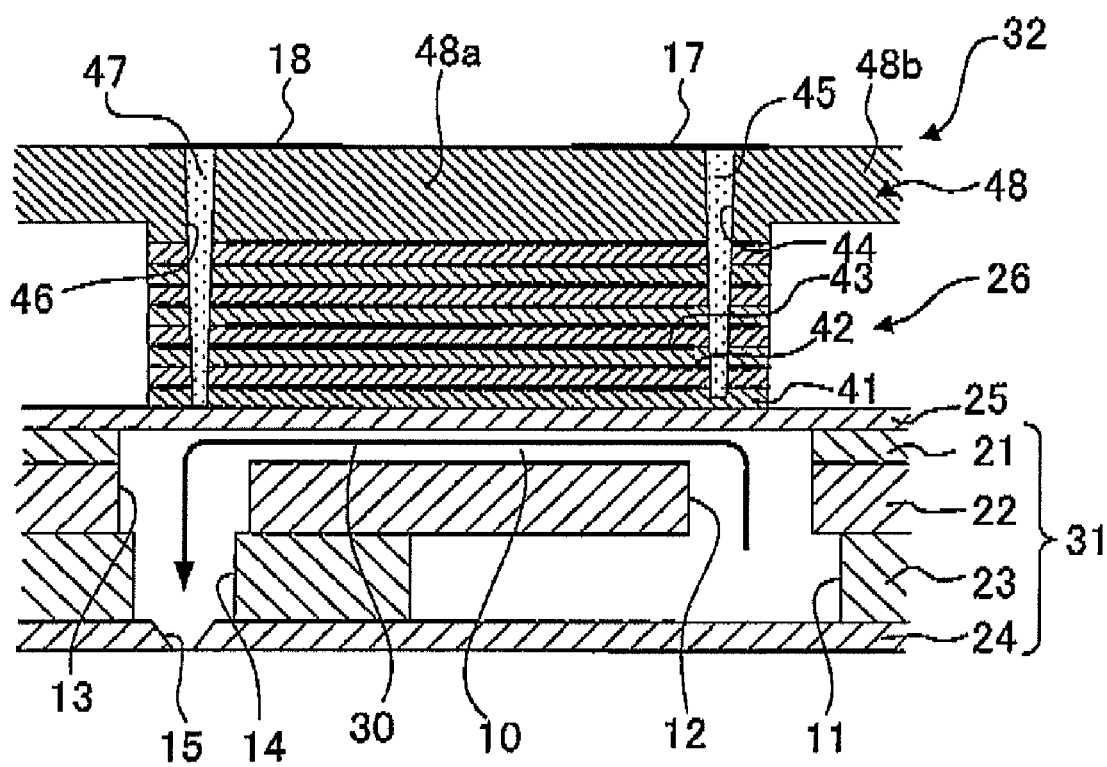
FIG. 3 is a sectional view taken along line III-III in FIG. 2.
Figure 4:
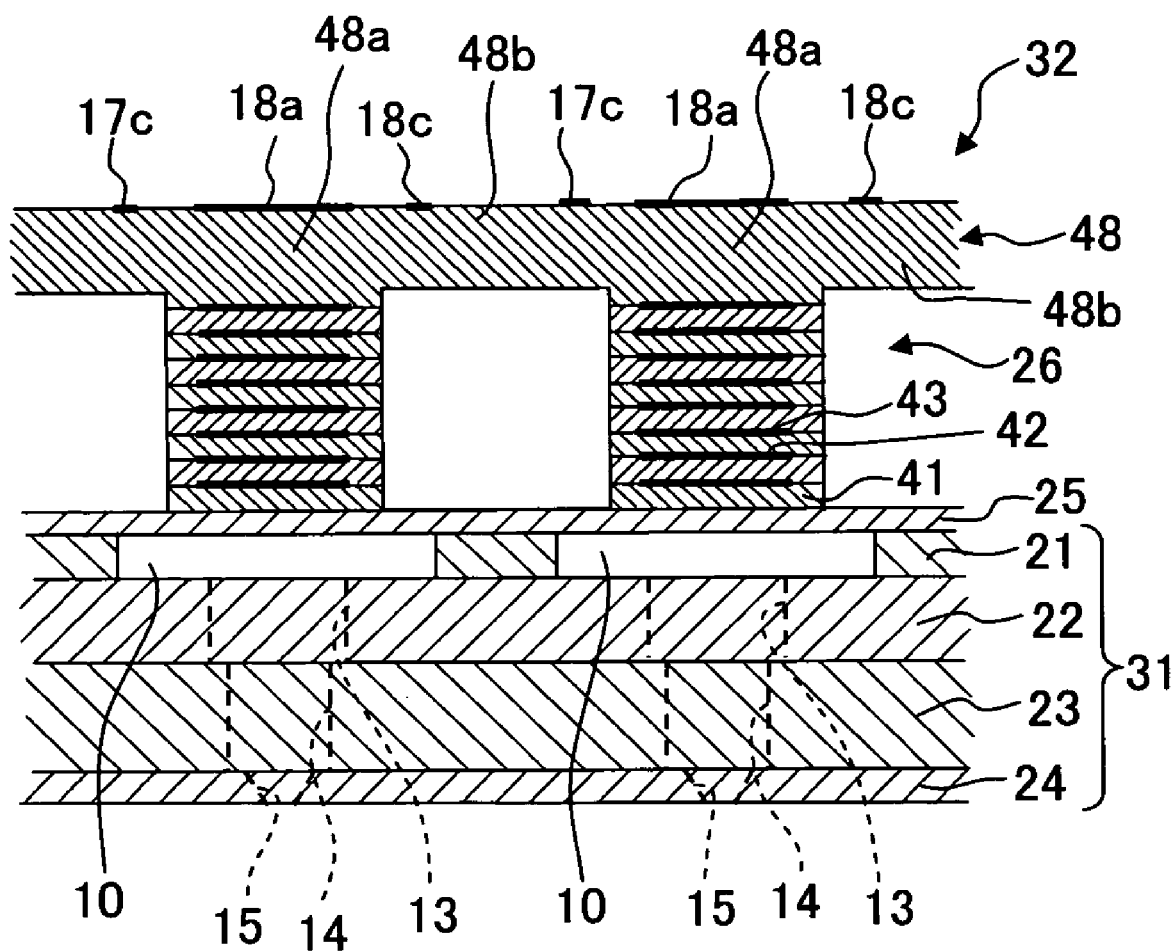
FIG. 4 is a sectional view taken along line IV-IV in FIG. 2.

Next, the ink-jet head 3 will be explained with reference to FIG. 2 to FIG. 4. FIG. 2 is a plan view of the ink-jet head 3, FIG. 3 is a sectional view taken along line III-III in FIG. 2, and FIG. 4 is a sectional view taken along line IV-IV in FIG. 2. As shown in FIGS. 2 to 4, the ink-jet head 3 includes a channel unit 31 in which a plurality of individual ink channels (fluid channels) 30 are formed, and a piezoelectric actuator 32 which is arranged on one surface of the channel unit 31.

Figure 5:
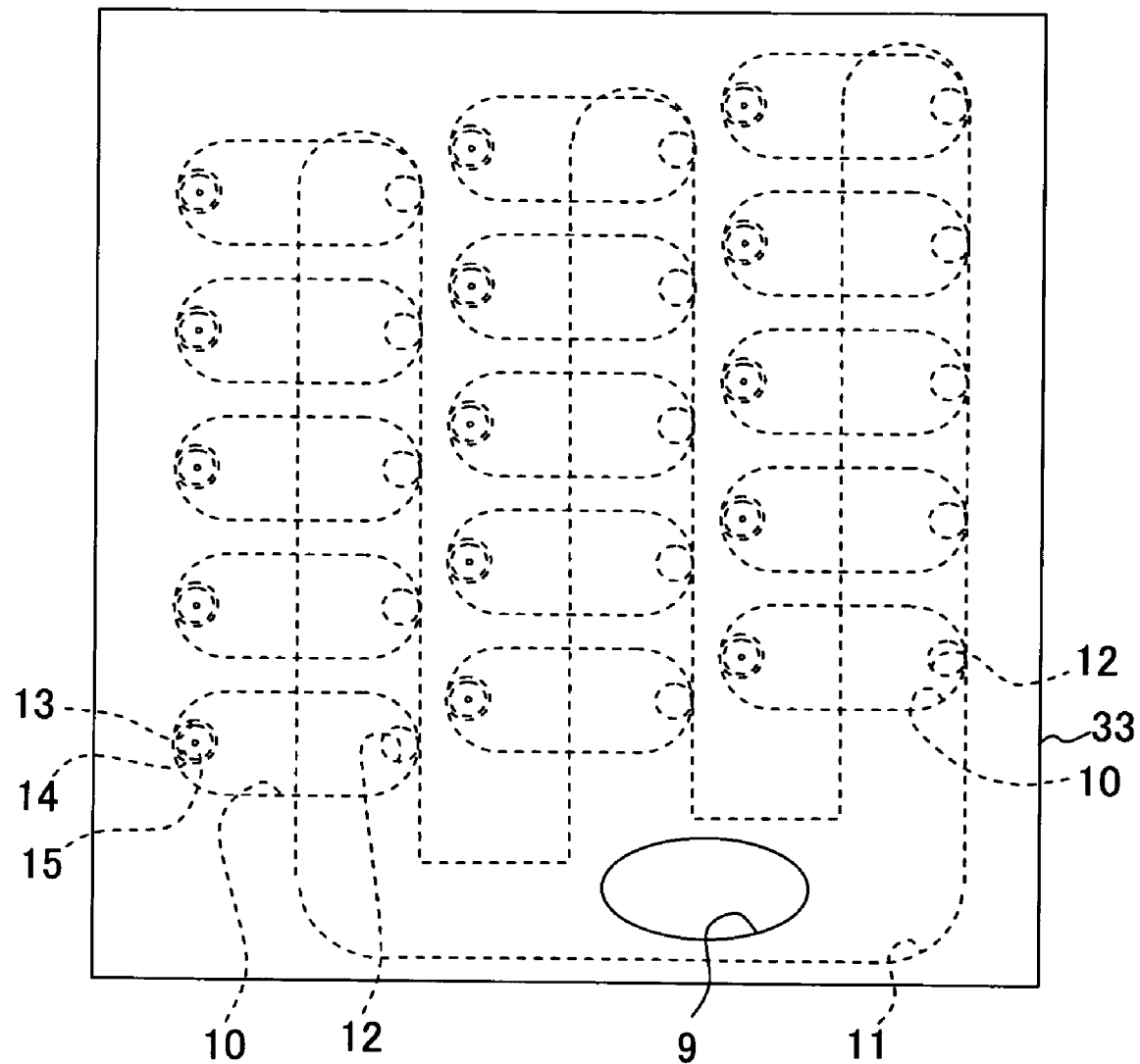
FIG. 5 is a plan view of FIG. 2 in which piezoelectric elements are omitted.

Next, the channel unit 31 will be explained with reference to FIGS. 2 to 5. FIG. 5 is a plan view of FIG. 2 in which the piezoelectric actuator 32 is omitted. As shown in FIGS. 3 and 4, the channel unit 31 includes a cavity plate 21, a base plate 22, a manifold plate 23, and a nozzle plate 24, and these four plates are joined and stacked as laminated layers. Among these four plates, the cavity plate 21, the base plate 22, and the manifold plate 23 are stainless steel plates having a substantially rectangular shape. The nozzle plate 24 is formed of a high-molecular synthetic resin material such as polyimide, and is joined to the lower surface of the manifold plate 23. Alternatively, the nozzle plate 24 may also be formed of a metallic material, similar to the three plates 21 to 23.

As shown in FIGS. 2 to 5, in the manifold plate 21, a plurality of pressure chambers 10 are formed and aligned along a plane in three rows in the paper feeding direction (up and down direction in FIG. 2). A part of the pressure chambers 10 (15 pieces of pressure chambers 10) is shown in FIGS. 2 and 5. Each of the pressure chambers 10 is formed to have a substantially elliptic shape in a plan view (as viewed in a direction orthogonal to the plane in which the pressure chambers 10 are arranged), and is arranged so that its longitudinal direction is the scanning direction (left and right direction in FIG. 2). Communication holes 12 and 13 are formed in the base plate 22 at positions which overlap in a plane view with both end portions in the long axis direction respectively of one of the pressure chambers 10. Further, in the manifold plate 22, a manifold 11 is formed. The manifold 11 extends in three rows in the paper feeding direction and overlaps, in a plan view, with the communication holes 12. Ink is supplied from an ink tank (not shown in the diagram) to the manifold 11, via an ink supply port 9 formed in the vibration plate 25 which will be explained later. Furthermore, communication holes 14 are formed in the manifold plate 22 at positions each of which overlaps in a plane view with an end portion of one of the pressure chambers 10, the end portion being on a side opposite to the manifold 11. Moreover, nozzles 15 are formed in the nozzle plate 23 at positions each of which overlaps in a plan view with the end portion of one of the pressure chambers 10, the end portion being on the side opposite to the manifold 11.

As shown in FIGS. 2 to 5, the manifold 11 communicates with each of the pressure chambers 10 via one of the communication holes 12, and each of the pressure chambers 10 communicates with one of the nozzles 15 via the communication holes 13 and 14. Thus, a plurality of individual ink channels 30 each extending from the manifold 17 to one of the nozzles 15 via one of the pressure chambers 10 are formed in the channel unit 31.

Figure 6:
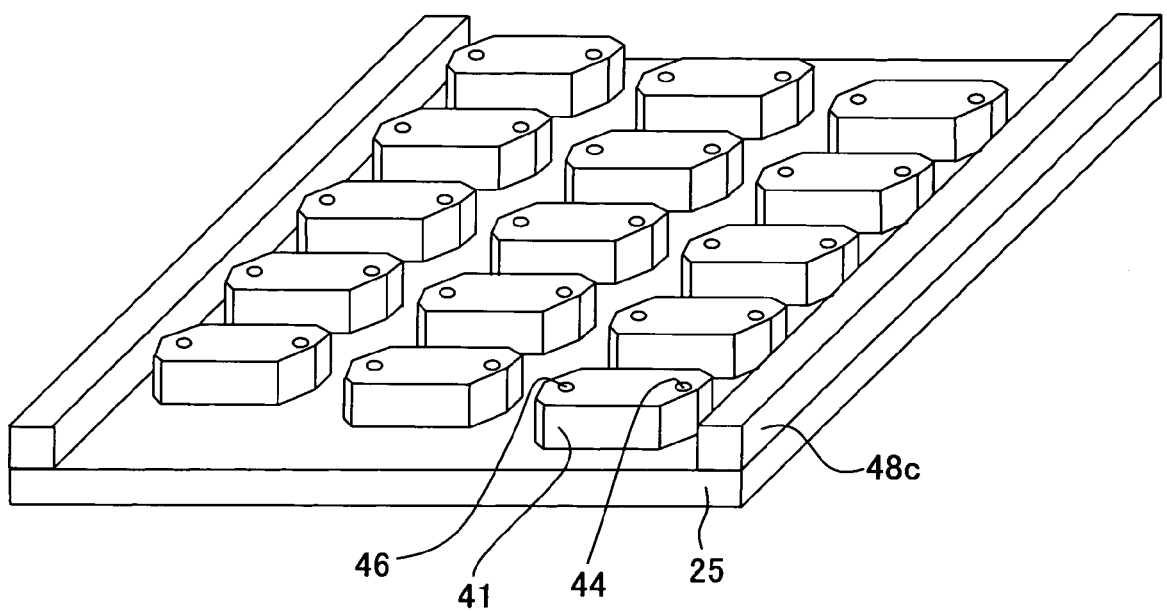
FIG. 6 is a perspective view of major portions of a piezoelectric actuator shown in FIG. 2.
Figure 7:
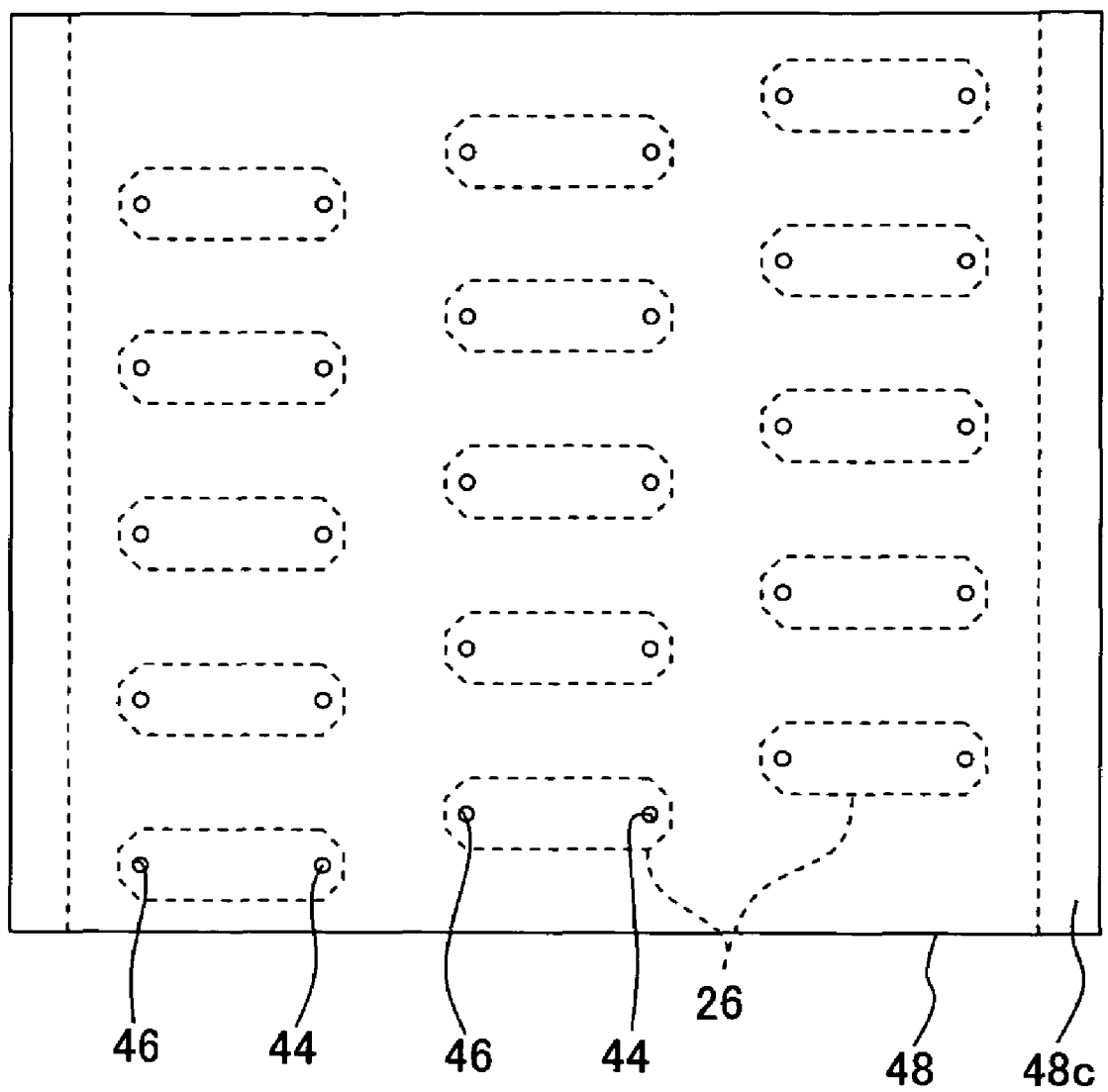
FIG. 7 is a plan view of the piezoelectric actuator shown in FIG. 6.

Next, the piezoelectric actuator 32 will be explained with reference to FIGS. 2 to 4, 6 and 7. FIG. 6 is a perspective view of major portions of the piezoelectric actuator 32, and FIG. 7 is a plan view of the piezoelectric actuator 32. It should be noted that in FIG. 6, a connecting member 48 which will be explained later is omitted.

As shown in FIGS. 3, 4 and 6, the piezoelectric actuator 32 includes a vibration plate 25 which is arranged on a surface of the cavity plate 21, and a plurality of piezoelectric elements 26 which are arranged on a surface of the vibration plate 25 on a side opposite to the cavity plate 21, at positions each of which faces one of the pressure chambers 10. The vibration plate 25 is made of a metallic material such as an iron alloy like stainless steel, a nickel alloy, an aluminum alloy, a titanium alloy, or a conductive material obtained by mixing silicon and a conductive resin to one of these metallic materials. As shown in FIGS. 3 and 4, the vibration plate 25 is joined to the cavity plate 21 so as to cover the plurality of pressure chambers 10.

Each of the piezoelectric elements 26 includes a plurality of stacked piezoelectric layers 41; individual electrodes 42 and common electrodes 43 which are arranged alternately between the stacked piezoelectric layers 41, with one of the piezoelectric layers 41 intervening between one of the individual electrodes 42 and one of the common electrodes 43; and a base portion 48a of a supporting member 48 arranged on the uppermost piezoelectric layer 41 included in the piezoelectric layers 41. The piezoelectric elements 26 are arranged in three rows in the paper feeding direction, corresponding to the pressure chambers 10 respectively. As shown in FIG. 7, the piezoelectric layers 41 have a substantially octagonal shape in a plan view which is smaller in size to some extent than the pressure chamber 10. As shown in FIGS. 3 and 4, the piezoelectric layers 41 are stacked, on the surface of the vibration plate 25 on a side opposite to the cavity plate 21, at positions each of which faces one of the pressure chambers 10. The shape of the piezoelectric layers 41 may be substantially oval shape, other than the substantially octagonal shape, in a plan view.

As shown in FIG. 3, the individual electrodes 42 extend more rightward than the common electrodes 43 with respect to a pressure chamber 10 which corresponds to the individual electrodes 42 and is included in the pressure chambers 10, the individual electrodes 42 extending to such an extent so as not to be exposed in a side surface or surfaces of one of the piezoelectric elements 26. The common electrodes 43 extend more leftward than the individual electrodes 42, with respect to the pressure chamber 10 corresponding thereto and included in the pressure chambers 10, the common electrodes 43 extending to such an extent so as not to be exposed in a side surface or surfaces of one of the piezoelectric elements 26. In this manner, the individual electrodes 42 and the common electrodes 43 are arranged at positions in which the individual electrodes 42 and the common electrodes 43 are staggered with each other, and non-overlapping areas, in each of which the individual and common electrodes are not overlapped with each other, exist in each of the piezoelectric elements 26. These non-overlapping areas include an area in which only the individual electrodes 42 are overlapped in a plan view and an area in which only the common electrodes 43 are overlapped in a plan view. Further, none of the individual electrodes 42 and common electrodes 43 are exposed at a side surface or surfaces of each of the piezoelectric elements 26. Accordingly, it is possible to prevent the short circuit between the individual electrodes 42 and the common electrodes 43 from occurring on a side surface or surfaces of the piezoelectric element 26.

The supporting member 48 is formed of a piezoelectric ceramic material similar to the piezoelectric layers 41, and is arranged to spread over the stacked piezoelectric layers 41 (so that the supporting member 46 wholly covers the stacked piezoelectric layers 41 thereover). The supporting member 48 includes a plurality of base portions 48a each of which is located at a position facing the piezoelectric layers 41 in a plan view, and which constructs a portion of one of the piezoelectric elements 26; and connecting portions 48b which are disposed between the base portions 48a to connect the plurality of piezoelectric portions 26 with each other. Further, the supporting member 48 has connecting portions 48c at its both ends (left and right ends in FIGS. 6 and 7), and the supporting member 48 is joined to the vibration plate 25 at these connecting portions 48c. In this manner, the supporting member 48 is arranged so as to spread over the piezoelectric elements 26 (so that the supporting member wholly covers the piezoelectric actuators 26 thereover), and supports the piezoelectric elements 26 such that the deformation of the piezoelectric layers 41 of each of the piezoelectric elements 26, caused when the piezoelectric actuator 32 is driven as will be explained later, is effectively transmitted to the vibration plate 25. The supporting member 48 may be composed of a non-conductive material such as synthetic resin, other than the piezoelectric ceramic material.

Further, as shown in FIG. 3, a through hole 44 is formed in each of the piezoelectric elements 26 at an area in which only the individual electrodes 42 are overlapped in a plan view, the through hole 44 extending linearly in the stacked direction (thickness direction) of the piezoelectric layers 41 from a surface of the piezoelectric element 26 opposite to the vibration plate 26, namely from the upper surface of the base portion 48a. The through hole 44 extends across the stacked piezoelectric layers 41, and all of the individual electrodes 42 are exposed in the inner surfaces of the base portion 48a and piezoelectric layers 41 (first electrode-exposure portion), the inner surfaces forming the through hole 44. It should be noted, however, the through hole 44 does not penetrate through the lowermost piezoelectric layer 41 joined to the vibration plate 25, and thus does not extend up to the vibration plate 25.

Furthermore, as shown in FIG. 3, a through hole 46 is formed in each of the piezoelectric elements 26 at an area in which only the common electrodes 43 are overlapped in a plan view, the through hole 46 extending linearly in the stacked direction (thickness direction) of the piezoelectric layers 41 from the upper surface of the base portion 48a. The through hole 46 extends across the stacked piezoelectric layers 41, and all of the common electrodes 43 are exposed in the inner surfaces of the base portion 48a and piezoelectric layers 41 (second electrode-exposure portion), the inner surfaces forming the through hole 46. Further, the through hole 46 penetrates through the lowermost piezoelectric layer 41 joined to the vibration plate 25, and thus extends up to the vibration plate 25.

The through hole 44 and the through hole 46 are filled with a conductive material 45 (first conductive material) and a conductive material 47 (second conductive material) respectively. The conductive materials 45, 47 are composed of solder, silver, gold or the like. Accordingly, the conductive material 45 filled in the through hole 44 electrically conducts the individual electrodes 42, of each of the piezoelectric elements 26, with each other, and the conductive material 47 filled in the through hole 46 electrically conducts the common electrodes 43, of each of the piezoelectric elements 26, with each other. In this case, as explained above, the through hole 44 does not extend up to the vibration plate 25. Thus, when the conductive material 45 is filled in the through hole 44, the conductive material 45 does not make contact with the vibration plate 25, and the individual electrodes 42 and the vibration plate 25 are not conducted with each other. The conductive materials 45, 47 may be formed of a same kind of conductive material, or may be formed of conductive materials different from each other.

As shown in FIGS. 2 to 4, a plurality of wirings 17 (first wirings), each of which includes a contact point 17a, a contact point 17b, and a wiring portion 17c, are formed on a surface of the supporting member 48 opposite to the vibration plate 25, namely on the upper surface of the supporting member 48. The contact points 17a are formed at positions overlapping in a plan view with the through holes 44 respectively, and are connected to the conductive material 45. The contact points 17b are aligned at the right end of the supporting member 48 in the paper feeding direction. The wiring portions 17c extend, from the contact points 17a respectively, linearly in rightward direction to the contact points 17b respectively. Further, a wiring 18 (second wiring), which includes a plurality of contact points 18a, a plurality of contact points 18b, a plurality of wiring portions 18c, a wiring portion 18d, and a wiring portion 18e, is formed on the upper surface of the supporting member 48. The contact points 18a are formed at positions overlapping in a plan view with the through holes 46 respectively, and are connected to the conductive material 47. The contact point 18b is formed on the upper right end of the supporting member 48. The wiring portions 18c extend, from a contact point 18a in the first row from the right and from a contact point 18a in the second row from the right respectively, in the leftward direction and are connected to the wiring portion 18d. The wiring portion 18d extends in the paper feeding direction, and connects the contact points 18a located the third row with each other. The wiring portion 18e extends linearly in the rightward direction from the upper end of the wiring portion 18d, and is connected to the contact point 18b.

With this construction, the individual electrodes 42 of one of the piezoelectric elements 26 are connected, via the conductive material 45, to one of the wirings 17, and the common electrodes 43 of one of the piezoelectric elements 26 are connected, via the conductive material 47, to the wiring 18. Further, the contact points 17b are connected to a drive unit by a wiring member (not shown) such as FPC, and predetermined drive voltage is supplied from the drive unit selectively to the individual electrodes 42 of the piezoelectric elements 26. On the other hand, the contact point 18b is connected to the drive unit by a wiring member (not shown) such as FPC, and is maintained at ground potential (common reference potential), thereby maintaining the common electrodes 43 at ground potential.

As explained above, the upper surface of the supporting member 48 (the surfaces of the piezoelectric elements 26 opposite to the vibration plate 25) are formed with the wirings 17 each of which connects the individual electrodes 42 of one of the piezoelectric element 26 and the drive unit which applies the predetermined drive voltage to the individual electrodes 42 of each of the piezoelectric element 26; and the wiring 18 which is connected to the common electrodes 43 of each of the piezoelectric element 26 and which maintains the common electrodes 43 of each of the piezoelectric element 26 at ground potential. In other words, the wirings 17 and the wiring 18 are formed on one plane, thereby simplifying the structure for electric connection for the individual electrodes 43 and the structure for electric connection for common electrodes 43. In addition, since these connections can be easily made on one plane, namely on the upper surface of the supporting member 48, the connection reliability is also improved.

Next, the driving method of the piezoelectric actuator 32 will be explained. When drive voltage is supplied, via one of the first wirings 17, to a plurality of individual electrodes 42 of a piezoelectric element 26 corresponding to this first wiring 17 and included in the piezoelectric elements 26, the potential of the individual electrodes 42 and the potential of the common electrodes 43 maintained at ground potential becomes different. At this time, an electric field in a direction parallel to the thickness direction that is the polarized direction of the piezoelectric layers 41 is generated in the piezoelectric layer 41 at a portion (drive portion) sandwiched between one of the individual electrodes 42 and one of the common electrodes 43. Accordingly, due to the piezoelectric vertical effect, the drive portion of the piezoelectric layer 41 is expanded in the thickness direction. The expansion decreases the volume of a pressure chamber 10 corresponding to this piezoelectric element 26, thereby applying pressure to ink in the pressure chamber 10 to discharge ink droplet from a nozzle 15 communicated with the pressure chamber 10. Since each of the piezoelectric elements 26 has a plurality of pieces of piezoelectric layers 41, and when driven, the driving portions of these piezoelectric layers 41 are expanded in the thickness direction, the amount of deformation of the piezoelectric element 26 as a whole becomes great. Thus, it is possible to apply a substantial pressure to the ink in the pressure chamber 10.

At this time, even when the piezoelectric actuator 32 is driven to deform the drive portion of each of the piezoelectric layers 41, the supporting member 48 is hardly deformed. Accordingly, the connection between the individual electrodes 42 and one of the wirings 17 on the surface of the supporting member 48, and the connection between the common electrodes 43 and the wiring 18 on the surface of the supporting member 48 are not broken due to the deformation of the driving portions of the piezoelectric layers 41. This makes it possible to improve the reliability of electrical connection of the individual electrodes 42 and electrical connection of the common electrodes 43, and to consequently improve the reliability of the ink-jet printer 1.

Next, the method of producing the piezoelectric actuator 32 will be explained with reference to FIGS. 8 and 9 which show the producing steps of the piezoelectric actuator 32.

Figure 8A:
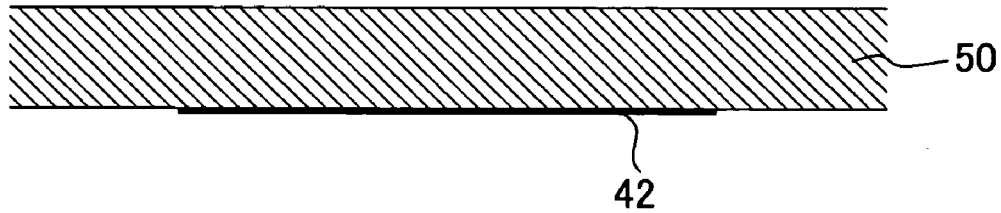
FIGS. 8A to 8D show first-half steps of producing process of the piezoelectric actuator shown in FIG. 2.

First, as shown in FIG. 8A, an individual electrode 42 is formed by screen printing on one surface of a substrate 50 made of a piezoelectric ceramic material, at a position which faces one of the pressure chambers 10. Other than by the screen printing, the individual electrode 42 can also be formed by placing a contact mask on the surface of the substrate 50, and by forming the individual electrode 42 thereover with a sputtering method, a vapor deposition method or the like. Alternatively, the individual electrode 42 can be formed by printing a conductive material on the entire surface of the substrate 50, and then by removing an unnecessary portion by laser or the like. The substrate 50 is not limited to a piezoelectric ceramic material, but may be formed of a non-conductive material exemplified by a ceramic material such as alumina and zirconia, a synthetic material, and the like.

Figure 8B:
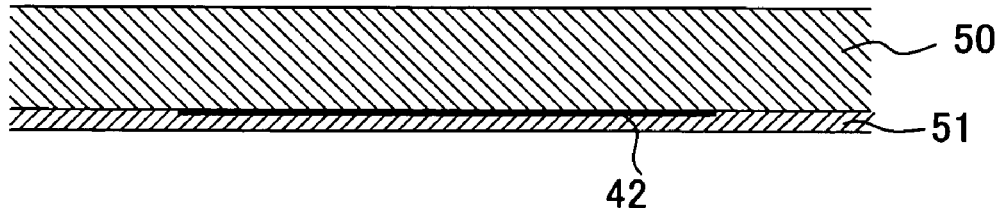

Next, as shown in FIG. 8B, a piezoelectric ceramic layer 51 is formed by sticking a green sheet of piezoelectric ceramics on the surface of the substrate 50 in which the individual electrode 42 has been formed. Other than by sticking the green sheet, the piezoelectric ceramic layer 51 can be formed by an aerosol deposition method (AD method) in which very fine particles of a piezoelectric material are blown onto a substrate to be collided on the substrate at a high velocity and are deposited on the substrate. Alternatively, the piezoelectric ceramic layer 51 can be formed by a method such as the sputtering method, a chemical vapor deposition method, or a hydrothermal synthesis method.

Figure 8C:
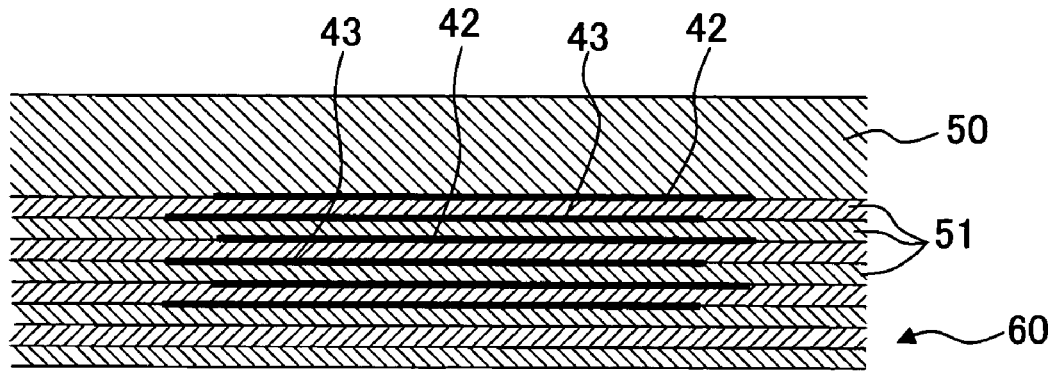

Next, as shown in FIG. 8C, a common electrode 43 is formed, on a surface of the piezoelectric ceramic layer 51 opposite to the surface formed with the individual electrode 42, at the position facing one of the pressure chambers 10. At this time, the common electrode 43 and the individual electrode 42 are arranged to stagger from each other (not to completely overlap with each other) such that the right end of the individual electrode 42 is positioned, in a plan view, more rightward with respect to the right end of the common electrode 43; and that the left end of the common electrode 43 is positioned, in a plan view, more leftward with respect to the left end of the individual electrode 42. Then, on the surface of the piezoelectric ceramic layer 51 where the common electrode 43 has been formed, another piezoelectric ceramic layer 51 is further formed. Subsequently, the similar operation is repeated to stack a plurality of piezoelectric ceramic layers 51, a plurality of individual electrodes 42, and a plurality of common electrodes 43, thereby forming a stacked body 60 as shown in FIG. 8C in which the individual electrodes 42 and the common electrodes 43 are alternately arranged between the stacked piezoelectric ceramic layers 51, with one of the piezoelectric ceramic layers 51 intervening between one of the individual electrodes 42 and one of the common electrodes 43 (Stacking step).

Figure 8D:
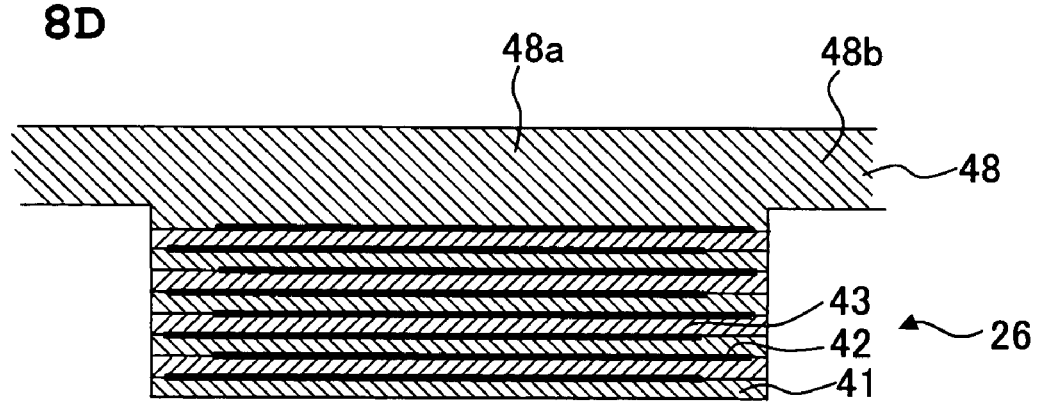

Next, as shown in FIG. 8D, portions of the piezoelectric ceramic layers 51 in the stacked body 60, which do not overlap in a plan view with both the individual electrodes 42 and the common electrodes 43, are removed by a method such as a micro blast processing and a dicer processing, thereby dividing the piezoelectric ceramic layers 51 (Dividing step). In FIG. 8D, only a piezoelectric element 26 of the piezoelectric elements 26 is shown. At this time, however, portions of the piezoelectric ceramic layers 51 in the vicinity of the ends of the individual electrodes 42 and the ends of the common electrodes 43 are not removed, so as to prevent the ends of the individual electrodes 42 and common electrodes 43 from being exposed at the side surface or surfaces of the piezoelectric element 26. Accordingly, a plurality of piezoelectric layers 41 are formed by dividing the piezoelectric ceramic layers 51. Each of the piezoelectric elements 26 has a plurality of piezoelectric layers 41. In addition, a base portion 48a of the supporting member 48 is formed at a portion of substrate 50, the portion facing the piezoelectric layers 41 of one of the piezoelectric elements 26, and a connecting portion 48b is formed between this base portion 48a and another base portion 48a formed for an adjacent piezoelectric element 26. In this manner, a plurality of the piezoelectric elements 26 each of which has a plurality of stacked piezoelectric layers 41, a plurality of individual electrodes 42, a plurality of common electrodes 43, and a base portion 48a of the supporting member 48. Although not shown, connecting portions 48c of the supporting member 48 is also formed in this dividing step by not removing the both end portions of the substrate 50. The connecting portions 48c are formed at the end portions respectively, and are to be connected to the vibration plate 25.

Figure 9A:
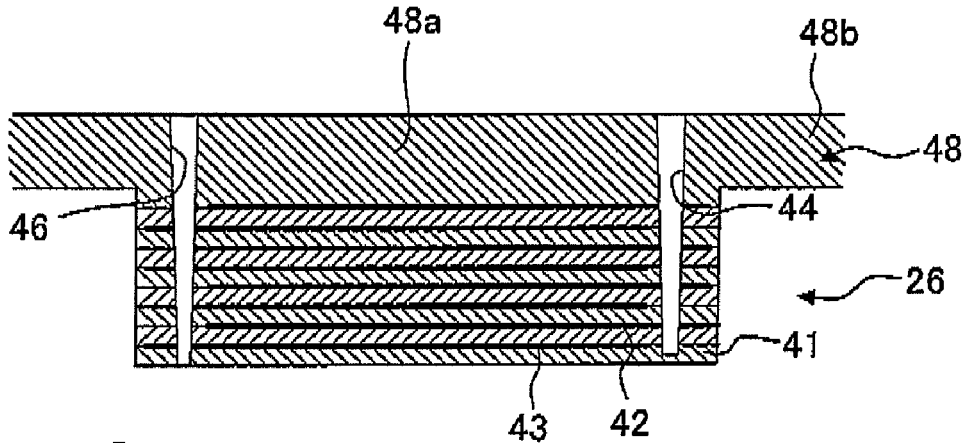
FIGS. 9A to 9C show last-half steps of producing process of the piezoelectric actuator shown in FIG. 2.

Next, as shown in FIG. 9A, excimer layer or femto-second laser is irradiated onto the upper surface of the base portion 48a at a portion in which only the individual electrodes 42 are overlapped in a plan view (namely, a portion facing the right ends of the individual electrodes 42 in FIG. 9A), the base portion 48a being one surface of the piezoelectric element 26, thereby forming a through hole 44 which extends in the stacking direction of the piezoelectric layers 41. Further, in a similar method, a through hole 46 is formed on the upper surface of the base portion 48a at a portion in which only the common electrodes 43 are overlapped in a plan view (namely, a portion facing the left ends of the common electrodes 43 in FIG. 9A), thereby forming a through hole 46 which extends in the stacking direction of the piezoelectric layers 41 (Exposure portion forming step). At this time, the through hole 44 is formed such that the through hole 44 does not penetrate through the lowermost piezoelectric layer 41 of the piezoelectric layers 41. On the other hand, the through hole 46 is formed such that the through hole 46 penetrates through all the common electrodes 43 and further penetrates through the lowermost piezoelectric layer 41. At this time, in the inside of through hole 44, only the individual electrodes 46 are exposed; and in the inside of through hole 46, only the common electrodes 43 are exposed. Since the through holes 44, 46 extend linearly, it is possible to form the through holes 44, 46 at a time, after stacking the piezoelectric ceramic layers 51, the individual electrodes 42 and the common electrodes 43 in the above-described stacking step. Accordingly, the formation of through holes 44, 46 becomes easy. Further, the through holes 44, 46 are formed by irradiating laser toward a same plane of the supporting member 48. Accordingly, it is possible to form the through holes 44, 46 simultaneously, thereby simplifying the production process. Alternatively, it is also possible to form the through holes 44, 46 such that both the through holes 44, 46 do not penetrate through the lowermost piezoelectric layer 41, and it is possible to form the through holes 44, 46 with arbitrary depth. Other than the method of irradiating laser, the through holes 44, 46 can also be formed by perforating holes on the upper surface of the supporting member by using a drill. Still alternatively, the exposure portion forming step and the above-explained dividing step may be exchanged in the sequence of producing process.

Figure 9B:
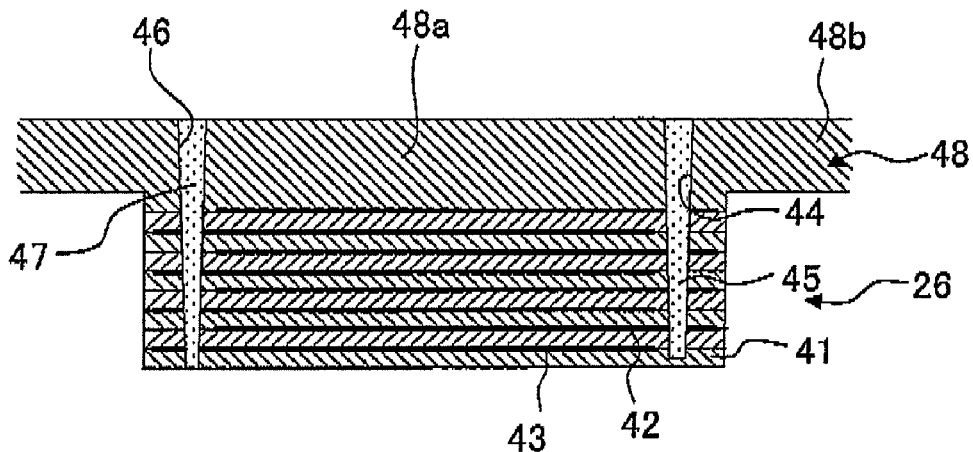

Next, as shown in FIG. 9B, a conductive material 45 made of solder, silver, gold or the like is filled in the through hole 44; and a conductive material 47 made of solder, silver, gold or the like is filled in the through hole 46 (Filling step). In particular, the conductive material 45 is filled in the through hole 44 by depressurizing the inside of through hole 44 and then by dripping the conductive material 45 from the upper surface of the base portion 48a into the through hole 44. At this time, the conductive material 45 filled in the through hole 44 makes contact with the individual electrodes 42 exposed in the through hole 44, thereby conducting the individual electrodes 42 with each other. Further, the conductive material 47 is filled in the through hole 46 the conductive material 47 filled in the through hole 46 makes contact with the common electrodes 43 exposed in the through hole 46, thereby conducting the individual electrodes 43 with each other.

Accordingly, upon conducting the individual electrodes 42 with each other and conducing the common electrodes 43 with each other, there is no need to perform the processing from a side surface or surfaces of the piezoelectric element 26, and the individual electrodes 42 can be conducted with each other and common electrodes 43 can be conducted with each other by pouring the conductive material from the upper surface of the base portion 48a (from a direction which is same as the direction of the exposure portion forming step). Accordingly, it is possible to easily conduct the individual electrodes 42 with each other and the common electrodes 43 with each other. When the conductive materials 45, 47, which are to be filled in the through holes 44, 46 respectively, are same, the filling of the conductive material 45, 47 can be performed simultaneously, thereby further simplifying the production process.

Figure 9C:
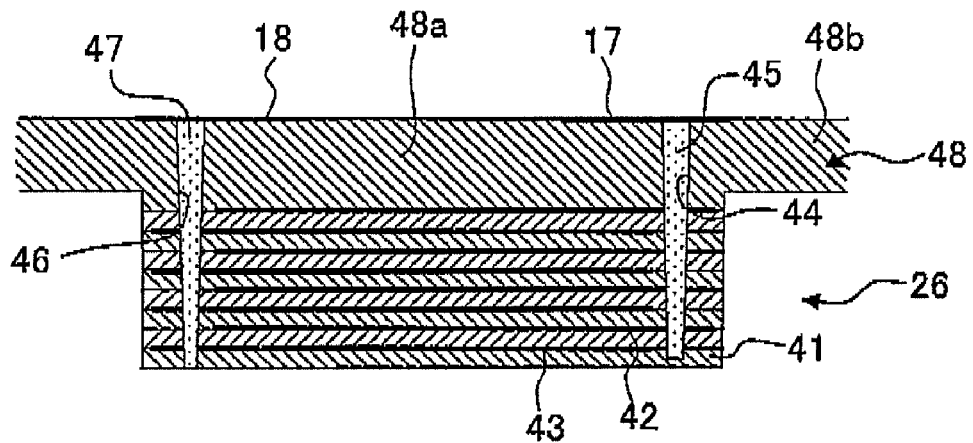

Next, as shown in FIG. 9C, a wiring 17 and a wiring 18 are formed (Wiring forming step). Accordingly, the individual electrodes 42 and the wiring 17 are connected via the conductive material 45, and the common electrodes 43 and the wiring 18 are connected via the conductive material 47. At this time, since the wirings 17, 18 are formed on a same plane, these wirings can be simultaneously formed by screen printing or the like. In addition, the connection between the individual electrodes 42 and the wiring 17, and the connection between the common electrodes 43 and the wiring 18 are performed on the upper surface of the supporting member 48. Accordingly, the structure of electric connection for the individual electrodes 42 and the structure of electric connection for the common electrodes 43 become simple. Further, since these connections can be easily made on one surface, the connection reliability is increased and the production cost is decreased. Afterwards, the lowermost piezoelectric layer 41 of the each of the piezoelectric elements 26 is bonded or joined to the vibration plate 25 with an adhesive or the like, thereby completing the production of the piezoelectric actuator 32.

Next, modified embodiments in which various modifications are made in this embodiment will be explained. The same reference numerals will be used for parts of components having the same structure as those in the first embodiment, and the explanation therefor will be omitted as appropriate.

First Modified Embodiment

Figure 10:
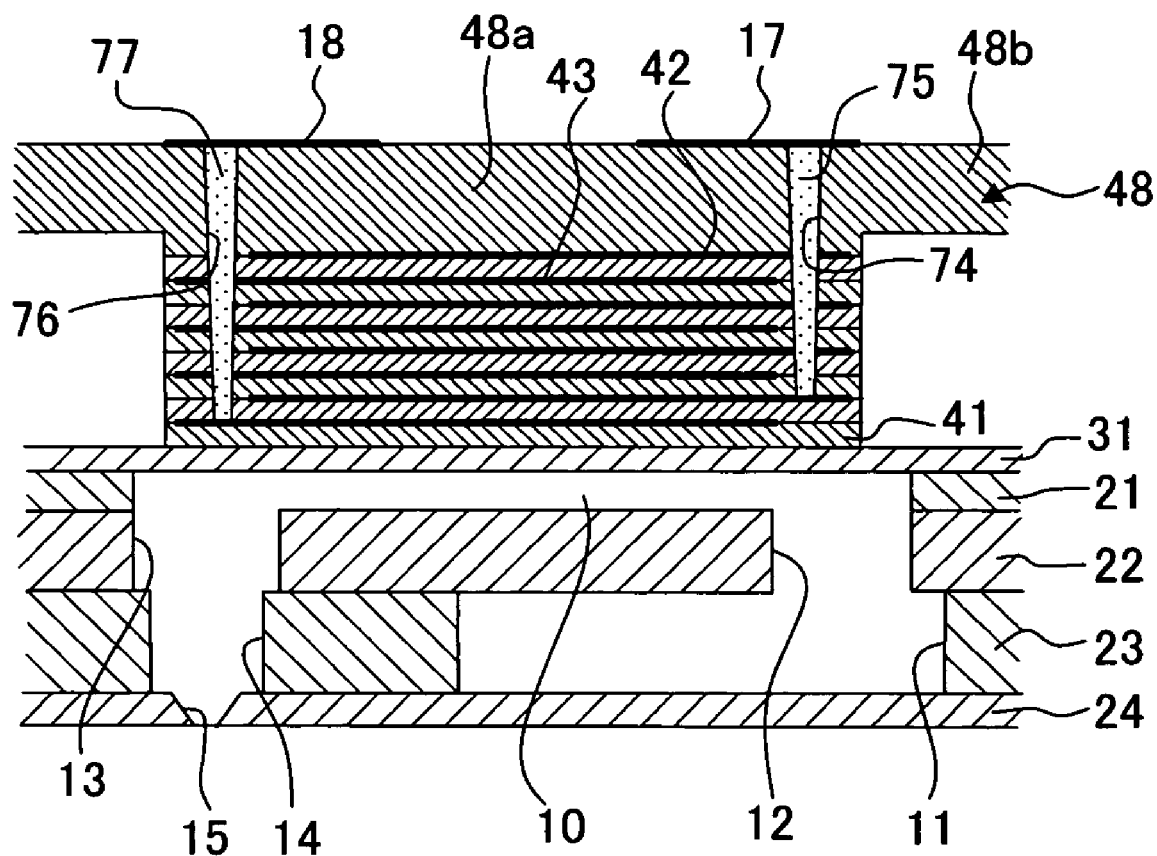
FIG. 10 is a sectional view showing a first modified embodiment, corresponding to FIG. 3.

As shown in FIG. 10, a through hole 74 may not penetrate through all of the individual electrodes 42 and a through hole 76 may not penetrate through all of the common electrodes 43; and ends of the individual electrodes 42 may be exposed in the inside of through hole 74, and ends of the common electrodes 43 may be exposed in the inside of through hole 76. Also in this case, the individual electrodes 42 are conducted with each other by a conductive material 75 filled in the through hole 74, and the common electrodes 43 are conducted with each other by a conductive material 77 filled in the through hole 76. By using the foregoing method of producing piezoelectric actuator, a through hole having arbitrary depth can be easily formed.

Second Modified Embodiment

Figure 11:
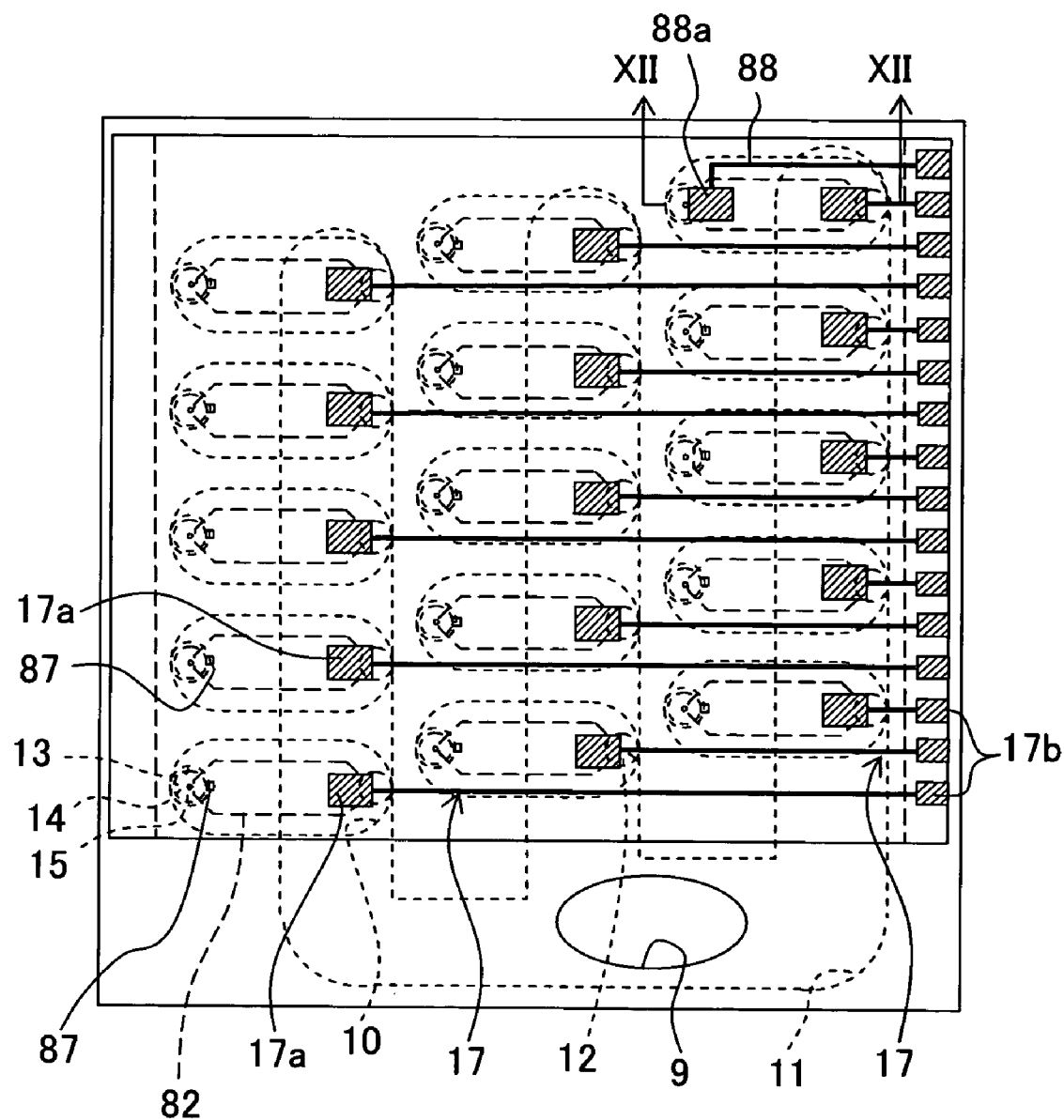
FIG. 11 is a plan view showing a second modified embodiment, corresponding to FIG. 2.
Figure 12:
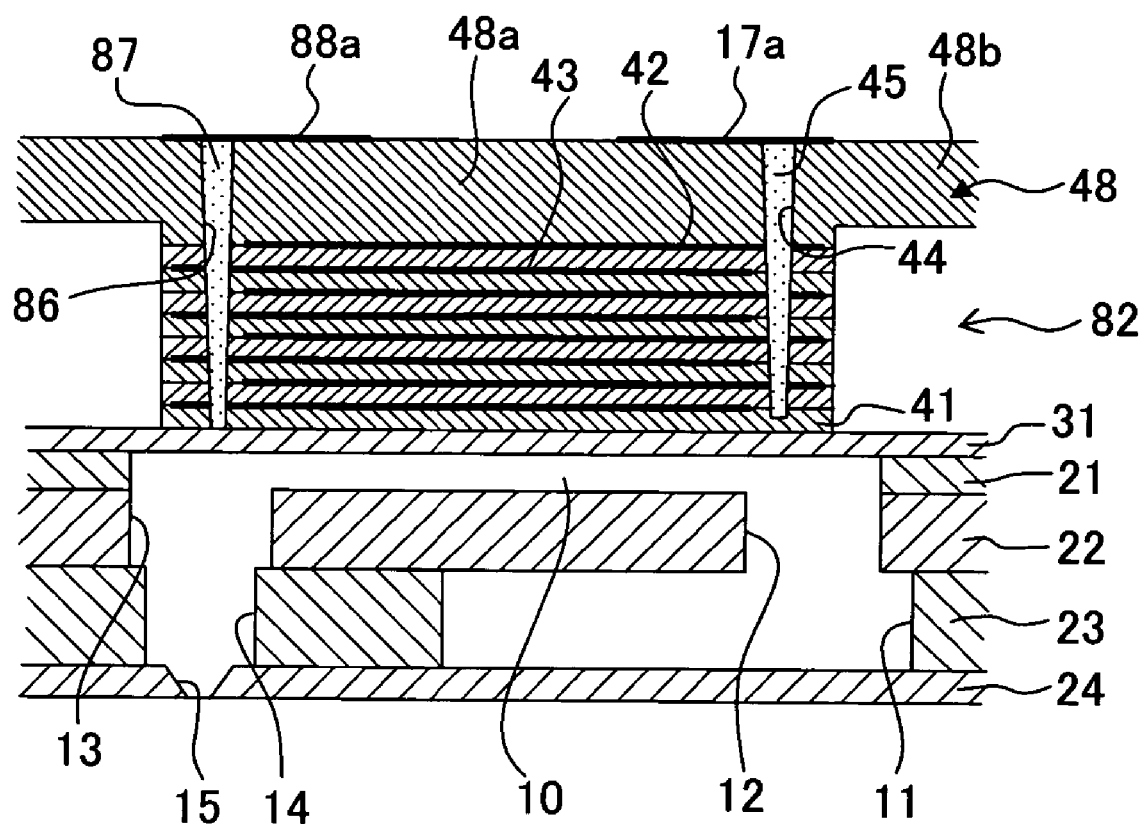
FIG. 12 is a sectional view showing the second modified embodiment, corresponding to FIG. 3.
Figure 13:
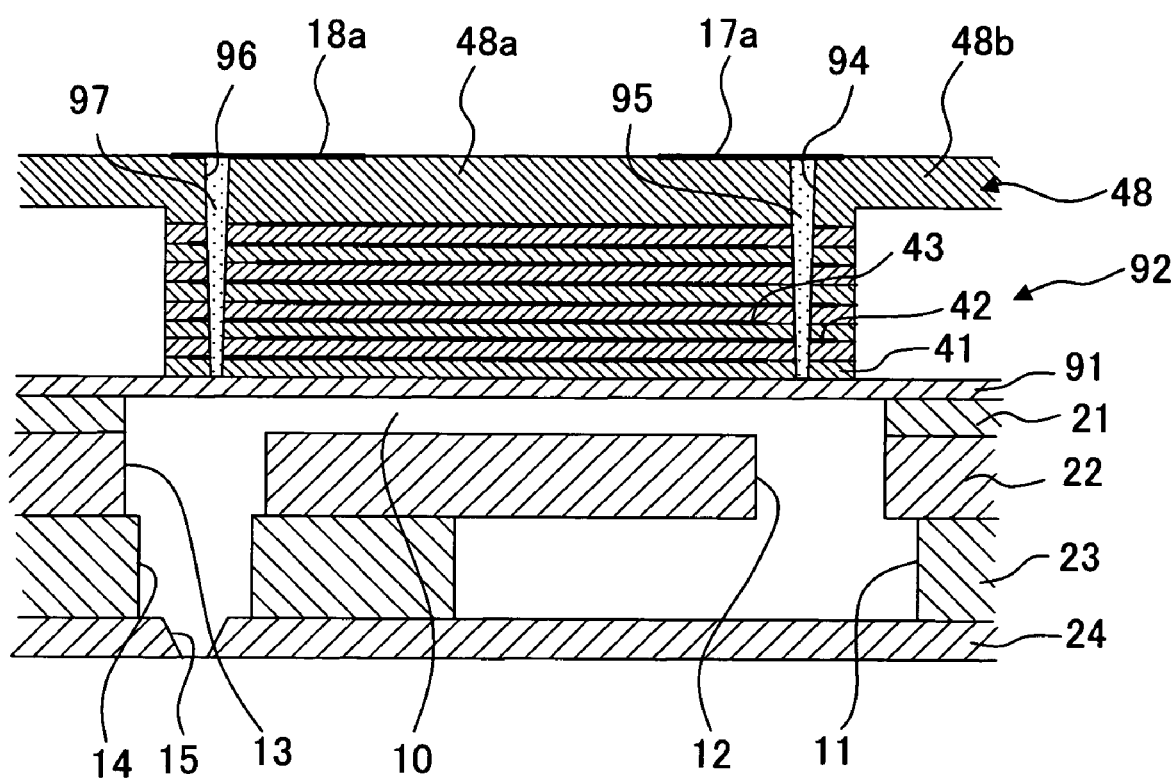
FIG. 13 is a sectional view showing a third modified embodiment, corresponding to FIG. 3.

Similar to the embodiment, when a vibration plate 31 is formed of a metallic material and a through hole 86 is extended up to the vibration plate 31, a wiring 88 may be connected to a conductive material 87 filled in a through hole 86 only at a contact point 88 which is formed at a position corresponding to one of piezoelectric elements 82 (a piezoelectric element 82 located at the uppermost right position in FIG. 11), as shown in FIGS. 11 and 12. It should be noted that FIG. 12 shows a cross section (cross section taken along a line XII-XII in FIG. 11) of a piezoelectric element 82 which is included in the piezoelectric elements 82 and in which the contact point 88a is formed on the upper surface of the supporting member 48. At this time, the conductive material 87 is filled in the through hole 86, the metallic vibration plate 31 and a plurality of common electrodes 43 of this piezoelectric element 82 are conducted with each other, and further, the common electrodes 43 of this piezoelectric element 82 and the common electrodes 43 of the other piezoelectric elements 82 are conducted with one another via the vibration plate 31. Accordingly, by only connecting a wiring 88 and a conductive material 87 in one through hole 86 via a contact point 88a, the common electrodes 43 of all the piezoelectric elements 82 can be maintained at ground potential, thereby simplifying the wiring on the surface of the supporting member 48.

Third Modified Embodiment

In a piezoelectric actuator 92, when a vibration plate 91 is formed of an insulative material (non-conductive material) such as synthetic resin, not only a through hole 96 but also a through hole 94 may penetrate all of the piezoelectric layers 41 and may extend up to the vibration plate 91. In this case, the through holes 94, 96 penetrate all of the stacked piezoelectric layers 41. Accordingly, upon forming the through holes 94, 96, there is no need to, for example, precisely control laser irradiation time for preventing the tips of the through holes 94, 96 from penetrating through the lowermost piezoelectric layer 41 which is to be joined to the vibration plate 91. Accordingly, the through holes 94, 96 can be formed easily. In addition, even when conductive materials 95, 97 are filled in the through holes 94, 96, respectively, and make contact with the vibration plate 91, the vibration plate 91 is formed of a non-conductive material. Therefore, there is no need to insulate the conductive materials 95, 97 and the vibration plate 91, simplifying the construction of the piezoelectric actuator 92. The vibration plate 91 is not limited to a vibration plate all of which is formed of non-conductive material. For example, the vibration plate 91 may be constructed of a substrate made of a conductive material, and a thin layer which is made of an insulative material and is formed on a surface of the substrate on a side opposite to the cavity plate 21. Further, this thin layer may be formed only at areas which correspond to one of the piezoelectric elements and which make contact with the conductive materials 95, 97 filled in the through holes 94, 96 respectively. Furthermore, this thin layer may be formed only at an area which corresponds to one of the piezoelectric elements and which makes contact with the conductive material 95 filled in the through hole 94.

Fourth Modified Embodiment

Figure 14:
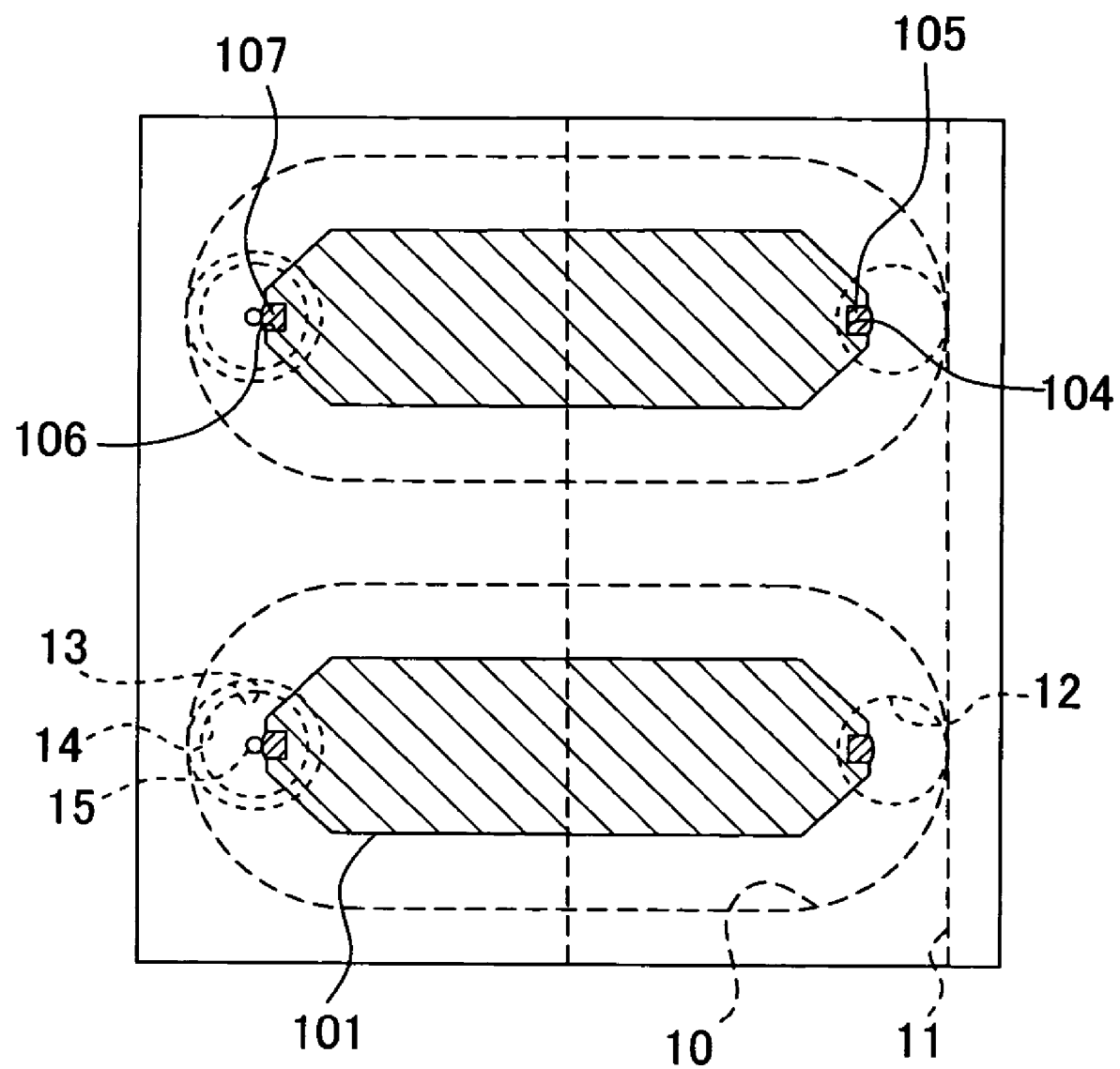
FIG. 14 is a partially enlarged plan view showing a fourth modified embodiment, corresponding to FIG. 2.
Figure 15:
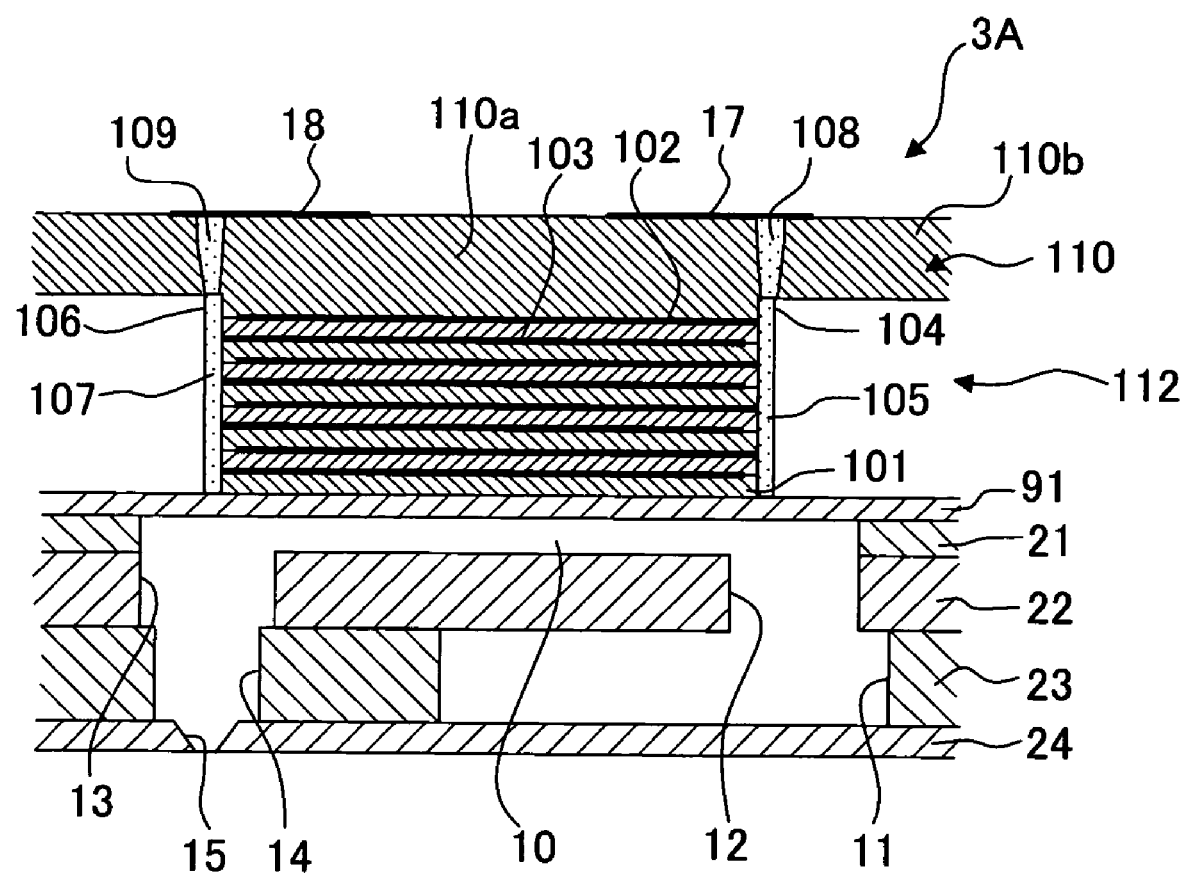
FIG. 15 is a sectional view showing the fourth modified embodiment, corresponding to FIG. 3.

As shown in FIGS. 14 and 15, a groove 104 (first electrode-exposure groove) which extends linearly across a plurality of stacked piezoelectric layers 101, the groove 104 extending in the stacking direction of the piezoelectric layers 101, may be formed at one side surface of each of piezoelectric elements 112 of a piezoelectric actuator 3A. Further, a groove 106 (second electrode-exposure groove) which extends linearly across the plurality of stacked piezoelectric layers 101, the groove 104 extending in the stacking direction of the piezoelectric layers 101, may be formed at the other side surface of each of the piezoelectric elements 112. In this case, a plurality of individual electrodes 102 extend up to the groove 104, and ends of the individual electrodes 102 are exposed on the surface of the groove 104; and a plurality of common electrodes 103 extend up to the groove 106, and ends of the common electrodes 103 are exposed on the surface of the groove 106. Further, holes 108, 109 are formed, in a base portion 110a of supporting member 110, at positions facing the grooves 104, 106, respectively. A conductive material 105 is filled in the hole 108 and the groove 104, and a conductive material 107 is filled in the hole 109 and the groove 106. Also in this case, in each of the piezoelectric elements 112, individual electrodes 102 are conducted with each other via the conductive material 105, and are connected to one of the wirings 17, via the conductive material 105, on the surface of the supporting member 110; and common electrodes 103 are conducted with each other via the conductive material 107, and are connected, via the conductive material 107, to the wiring 18 on the surface of the supporting member 110. It should be noted that in this case, the groove 104 and the hole 108 serve as the first electrode-exposure portion according to the present invention, and the groove 106 and hole 109 server as the second electrode-exposure portion according to the present invention.

A method of producing such a piezoelectric actuator 3A will be explained. In the stacking step, similarly to the embodiment, a plurality of piezoelectric ceramic layers 51, a plurality of individual electrodes 102, and a plurality of common electrodes 103 are stacked on a substrate 50. In the dividing step, concurrently with dividing the piezoelectric ceramic layers 51 into a plurality of piezoelectric elements 112, a portion of each of the ends in the longitudinal direction of one of the piezoelectric elements 112 is removed, thereby forming the grooves 104, 106. Further, a hole (through hole) 108 extending linearly in the stacking direction of the piezoelectric layers 101 is formed in a surface of the supporting member 110, the surface being on a side opposite to one of the piezoelectric elements 112, at a position facing the groove 104; and a hole (through hole) 109 extending linearly in the stacking direction of the piezoelectric layers 101 is formed in the surface of the supporting member 110, the surface being on the side opposite to one of the piezoelectric elements 112, at a position facing the groove 106. Furthermore, a conductive paste which is made of solder, silver, gold or the like and which corresponds to conductive material 105, 107 is poured into the holes 108, 109, and the hole 108 and the groove 104 are filled with the conductive material 105, and the hole 109 and the groove 106 are filled with the conductive material 107. Afterwards, in the wiring forming step, the wirings 17, 18 are formed similarly to the embodiment, and a lowermost piezoelectric layer 101, which is located in the lowermost position in each of the piezoelectric elements 112, is joined to the vibration plate 91, thereby completing the production of the piezoelectric actuator 3A.

Accordingly, after stacking the piezoelectric layers 110, the individual electrodes 102 and the common electrodes 103, the grooves 104, 106 can be formed easily at a time. Further, upon performing the division into the piezoelectric elements 112 in the dividing step, the grooves 104, 106 can be formed at the same time. Thus, the formation of grooves 104, 106 becomes easy. Also in this case, since the grooves 104, 106 can be filled with the conductive material by filling the conductive material from the holes 108, 109 respectively, there is no need to perform the processing at the side surface or surfaces of each of the piezoelectric elements, thereby simplifying the filling of conductive materials 105, 107. When the vibration plate 91 is formed of a metallic material, the conductive material 105 and the vibration plate 91 are prevented from making contact with each other, by, for example, providing a projection on a surface of the vibration plate 91 at a position facing the groove 104, the projection being formed of a non-conductive material such as a synthetic resin having a surface subjected to a liquid-repellent treatment by tetrafluoroethylene, ceramics, and the like.

Fifth Modified Embodiment

Figure 16:
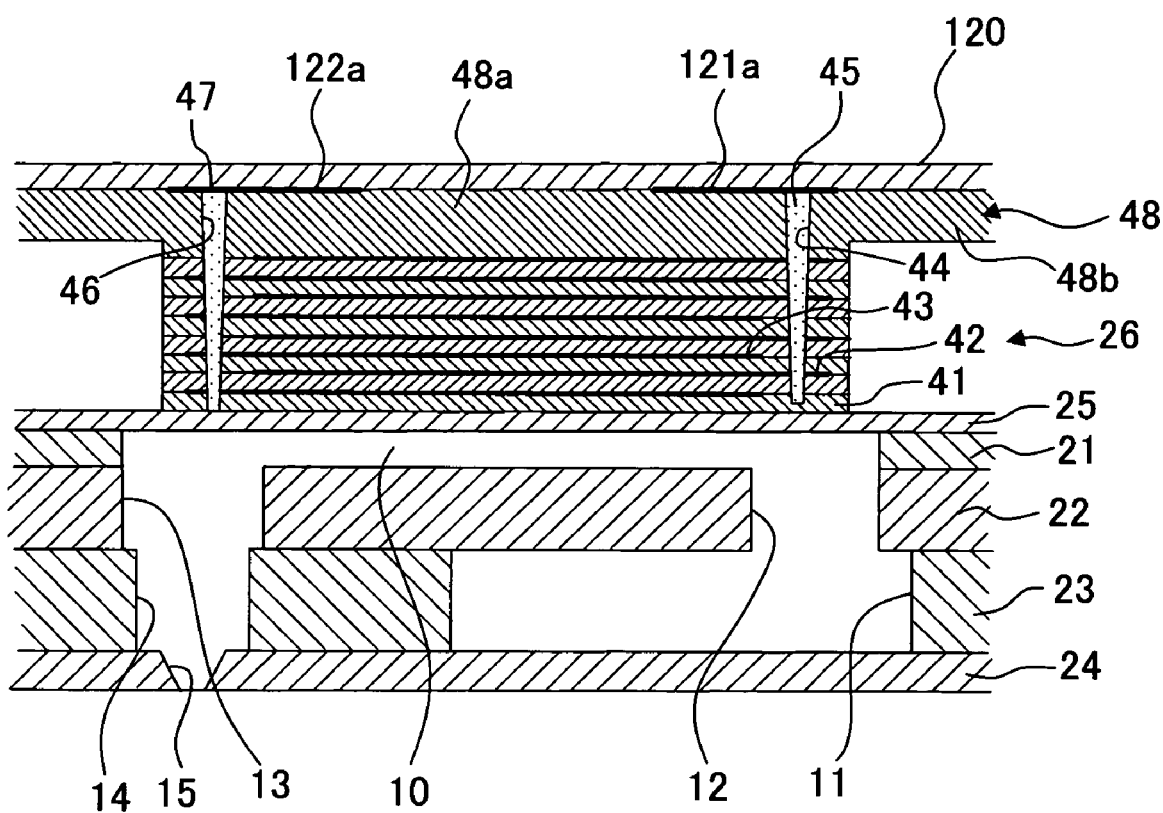
FIG. 16 is a sectional view showing a fifth modified embodiment, corresponding to FIG. 3.
Figure 17:
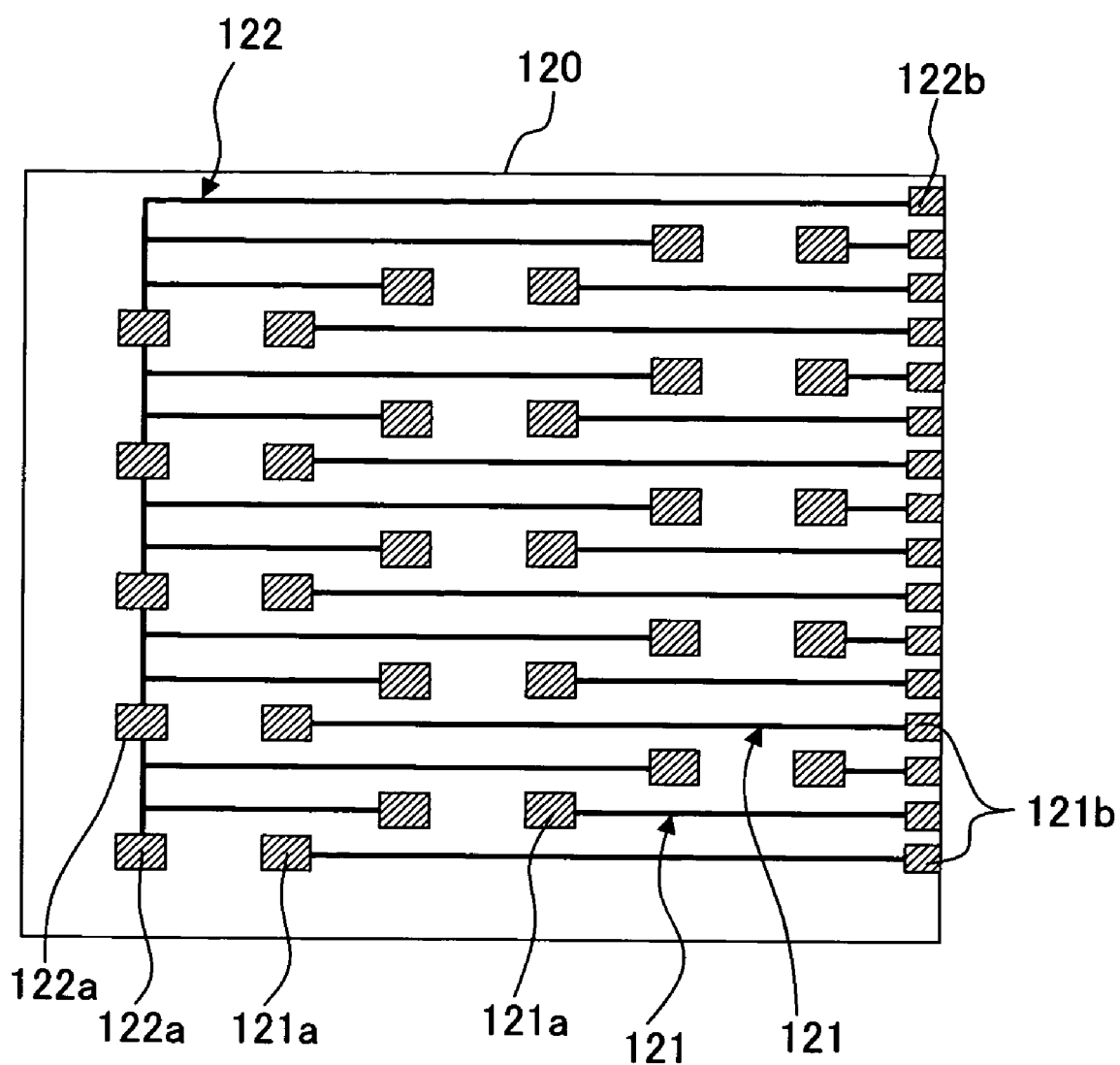
FIG. 17 is a plan view of FPC shown in FIG. 16.

As shown in FIG. 16, a construction may be adopted in which a flexible printed circuit board (FPC) 102 as shown in FIG. 17 is adhered to a surface of the supporting member 48. In this case, on a surface of the each of the piezoelectric elements 26 on the side opposite to the vibration plate, namely on the upper surface of the supporting member 48, the individual electrodes 42 are connected to one of contact points 121a of wirings 121 of the FPC 120, and are connected to the drive circuit via one of contact points 121b of wirings 121 of the FPC 120; and on the upper surface of the supporting member 48, the common electrodes 43 are connected to a contact point 122b of a wiring 122, is connected to the drive unit via the contact point 122b, and is maintained at ground potential. Here, the wirings 121, 122 correspond to the first and second wirings according to the present invention respectively. Also in this case, on the upper surface of the supporting member 48, the individual electrodes 42 and one of the wirings 121 of the FPC 120 are connected via the conductive material 45, and the individual electrodes 43 and the wiring 122 of the FPC are connected via the conductive material 47. Accordingly, the structure for electric connection for the individual electrodes 42 and the structure for electric connection for the common electrodes 43 become simple. In addition, since these connections can be easily made on one surface, thereby improving the connection reliability.

Sixth Modified Embodiment

Figure 18A:
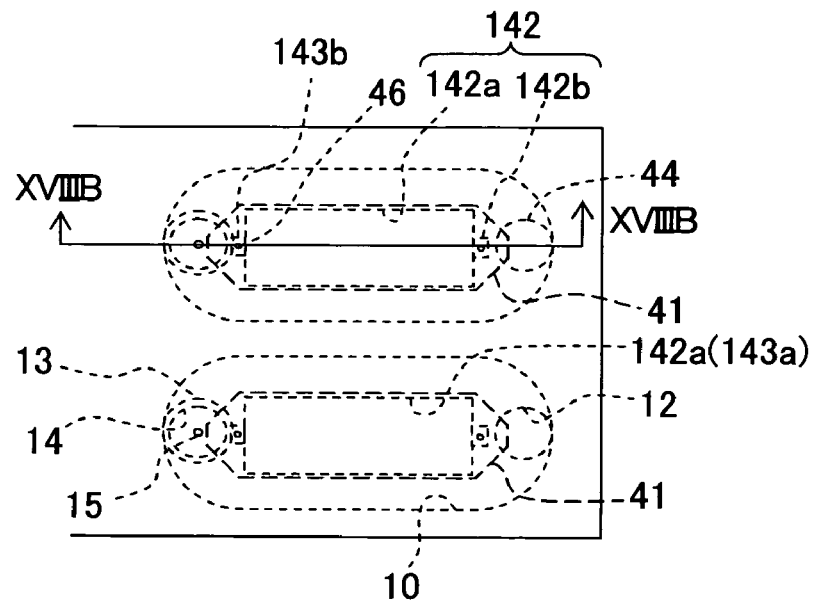
FIG. 18A is a partially enlarged view of a portion of an ink-jet head including a piezoelectric actuator of a sixth modified embodiment.
Figure 18B:
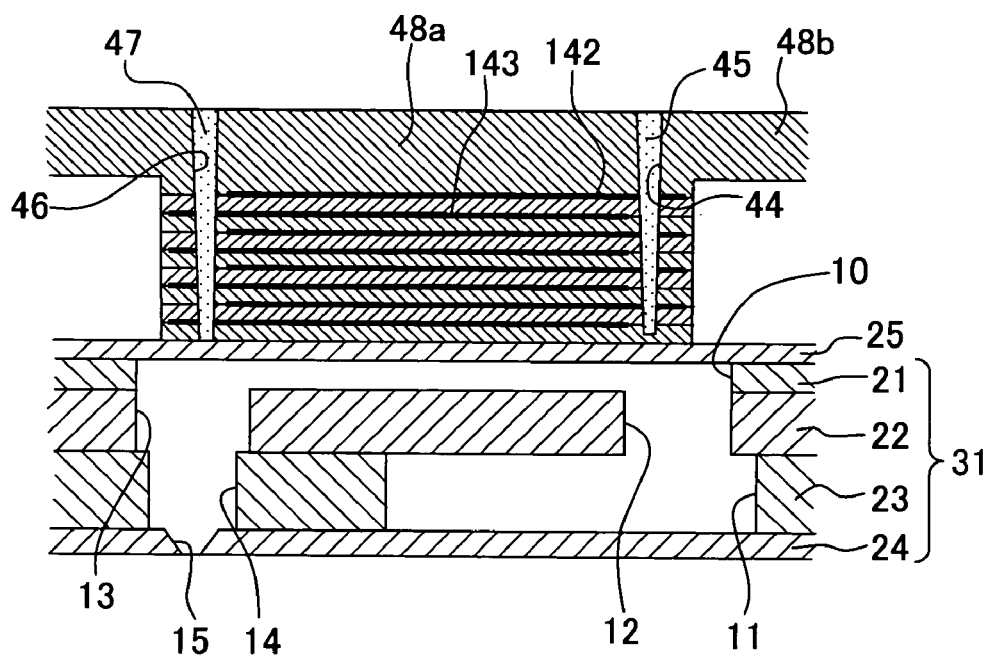
FIG. 18B is a sectional view taken along line XVIII B-XVIII B in FIG. 18A.

As shown in FIGS. 18A, 18B, a construction may be adopted in which individual electrodes 142 each have an electrode main body 142a and an electrode terminal 142b, and common electrodes 143 each have an electrode main body 143a and an electrode terminal 143b. The electrode main body 142a and the electrode main body 143a are same in size and in shape. The electrode main bodies 142a, 143a have a substantially rectangular shape in a plan view and are smaller in size to some extent than the piezoelectric layer 41. The electrode terminal 142b is formed at the right portion of the electrode main body 142a, and the electrode terminal 143b is formed at the left portion of the electrode main body 143a. In this case, even when the electrode main body 142a of the individual electrode 142 and the electrode main body 143a of the common electrode 143 are arranged to overlap in a plan view with the central portion of the pressure chamber 10, the electrode terminals 142b, 143b can be arranged at positions which do not overlap with each other in a plan view. The through holes 44, 46 are arranged in the piezoelectric layers 41 at areas which overlap in a plan view with the electrode terminals 142b, 143b, respectively. Accordingly, upon forming the individual electrodes 142 and the common electrodes 143 between the stacked piezoelectric layers 41, there is no need to arrange the individual electrodes 142 and the common electrodes 143 for making the individual electrodes 142 and the common electrodes 143 to be staggered with respect to each other (so that the electrodes 142 and 143 are not overlapped with each other). Thus, these electrodes can be easily formed.

The shape of the electrode main body 142 and electrode main body 143 is not limited to rectangular, but may take arbitrary shape. In addition, the electrode terminals 142b, 143b may be formed in the electrode main bodies 142a, 143a respectively at arbitrary positions provided that these positions do not overlap with each other in a plan view.

Although the example and modified examples, in which the liquid transporting apparatus of the present invention is applied to an ink-jet head, have been explained, the present invention is not limited to the example and modified examples. The present invention is applicable to a liquid transporting apparatus which transport liquid other than ink such as reagent, biological solution, solution of wiring material, solution of electronic material, coolant liquid, fuel liquid or the like.

What is claimed is:

1. A method of producing a piezoelectric actuator for a liquid transporting apparatus, the piezoelectric actuator being arranged on one surface of a channel unit in which a plurality of pressure chambers arranged along a plane are formed, the method comprising:

a stacking step of stacking a plurality of piezoelectric layers to form a stacked body such that: the stacked body has non-overlapping areas at each of which a plurality of first electrodes to which a predetermined drive voltage is applied and a plurality of second electrodes which are maintained at a common reference potential are not overlapped with each other as viewed in a direction orthogonal to the plane; and that the first electrodes and the second electrodes are arranged alternately between the piezoelectric layers;

a dividing step of dividing the stacked body to form a plurality of piezoelectric elements corresponding to the pressure chambers respectively, such that the stacked body comprises a supporting member which supports and connects the plurality of piezoelectric elements;

an exposure portion forming step of forming a first hole or groove at one of the non-overlapping areas in each of the piezoelectric elements, the first hole or groove extending linearly from one surface of each of the piezoelectric elements in a thickness direction which is a stacking direction of the piezoelectric layers, and being formed by a first electrode-exposure portion in which only the first electrodes are exposed; and of forming a second hole or groove at another of the non-overlapping areas in each of the piezoelectric elements, the second hole or groove extending linearly from the one surface of each of the piezoelectric elements in the thickness direction, and being formed by a second electrode-exposure portion in which only the second electrodes are exposed;

a filling step of filling a first conductive material, which electrically conducts the first electrodes with each other, in the first hole or groove formed by the first electrode-exposure portion; and of filling a second conductive material, which electrically conducts the second electrodes with each other, in the second hole or groove formed by the second electrode-exposure portion; and a wiring forming step of forming a first wiring to be connected to the first conductive material which is filled in the first hole or groove formed by the first electrode-exposure portion of each of the piezoelectric elements, the first wiring being formed on the one surface of each of the piezoelectric elements.

2. The method of producing the piezoelectric actuator according to claim 1, wherein:

the exposure portion forming step further comprises forming in the supporting member a plurality of through holes which penetrate through the supporting member and which are in communication with the first hole or groove and the second hole or groove, respectively; and the filling step further comprising filling the first conductive material and the second conductive material through the through holes, respectively, formed in the supporting member.

3. The method of producing the piezoelectric actuator according to claim 1, wherein the exposure forming step further comprises forming at least one of the first hole or groove or the second hole or groove completely through the stacked body.

* * * * *